United States Patent
Machkaoutsan et al.

(10) Patent No.: US 9,824,936 B2
(45) Date of Patent: Nov. 21, 2017

(54) ADJACENT DEVICE ISOLATION

(71) Applicant: QUALCOMM Incorporated, San Diego, CA (US)

(72) Inventors: Vladimir Machkaoutsan, Leuven (BE); Mustafa Badaroglu, Leuven (BE); Jeffrey Junhao Xu, San Diego, CA (US); Stanley Seungchul Song, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/293,213

(22) Filed: Oct. 13, 2016

(65) Prior Publication Data

US 2017/0033020 A1    Feb. 2, 2017

Related U.S. Application Data

(62) Division of application No. 14/633,011, filed on Feb. 26, 2015, now Pat. No. 9,502,414.

(51) Int. Cl.
*H01L 21/8238* (2006.01)
*H01L 27/092* (2006.01)
(Continued)

(52) U.S. Cl.
CPC .... *H01L 21/823828* (2013.01); *H01L 21/321* (2013.01); *H01L 21/32133* (2013.01);
(Continued)

(58) Field of Classification Search
None
See application file for complete search history.

(56) References Cited

U.S. PATENT DOCUMENTS 6,781,212 B1    8/2004    Kao et al.
6,806,137 B2    10/2004   Tran et al.
(Continued)

FOREIGN PATENT DOCUMENTS

EP          0321738 A2    6/1989
WO        2013101230 A1    7/2013
(Continued)

OTHER PUBLICATIONS

Hook T, "FinFET Siolation and Approaches and Ramifications: Bulk vs. SOI," FDSOI Workshop, Hsinchu Taiwan, Apr. 22, 2013.
(Continued)

*Primary Examiner* — Joseph Schoenholtz
(74) *Attorney, Agent, or Firm* — Qualcomm Incorporated/Seyfarth

(57) ABSTRACT

An integrated circuit (IC) device may include a first active transistor of a first-type in a first-type region. The first active transistor may have a first-type work function material and a low channel dopant concentration in an active portion of the first active transistor. The IC device may also include a first isolation transistor of the first-type in the first-type region. The second active transistor may have a second-type work function material and the low channel dopant concentration in an active portion of the first isolation transistor. The first isolation transistor may be arranged adjacent to the first active transistor.

10 Claims, 30 Drawing Sheets

(51) Int. Cl.
  *H01L 21/8234* (2006.01)
  *H01L 29/775* (2006.01)
  *H01L 29/66* (2006.01)
  *H01L 29/06* (2006.01)
  *H01L 29/78* (2006.01)
  *H01L 29/423* (2006.01)
  *H01L 21/321* (2006.01)
  *H01L 21/3213* (2006.01)
  *B82Y 10/00* (2011.01)
  *H01L 27/088* (2006.01)

(52) U.S. Cl.
  CPC ........ *H01L 21/823437* (2013.01); *H01L 21/823481* (2013.01); *H01L 21/823814* (2013.01); *H01L 21/823821* (2013.01); *H01L 21/823842* (2013.01); *H01L 21/823878* (2013.01); *H01L 27/092* (2013.01); *H01L 27/0922* (2013.01); *H01L 27/0924* (2013.01); *H01L 29/0642* (2013.01); *H01L 29/0669* (2013.01); *H01L 29/0673* (2013.01); *H01L 29/42392* (2013.01); *H01L 29/66439* (2013.01); *H01L 29/775* (2013.01); *H01L 29/785* (2013.01); *B82Y 10/00* (2013.01); *H01L 21/82345* (2013.01); *H01L 27/0883* (2013.01); *H01L 27/0886* (2013.01)

(56) References Cited

U.S. PATENT DOCUMENTS

| | | | | |
|---|---|---|---|---|
| 8,324,668 | B2* | 12/2012 | Huang | H01L 21/28123 257/288 |
| 8,378,419 | B2 | 2/2013 | Anderson et al. | |
| 8,609,510 | B1 | 12/2013 | Banna et al. | |
| 8,748,940 | B1 | 6/2014 | Rachmady et al. | |
| 2003/0180994 | A1* | 9/2003 | Polishchuk | H01L 21/28079 438/199 |
| 2011/0147765 | A1 | 6/2011 | Huang et al. | |
| 2012/0001232 | A1 | 1/2012 | Liaw | |
| 2012/0126336 | A1 | 5/2012 | Anderson et al. | |
| 2013/0099295 | A1 | 4/2013 | Baars et al. | |
| 2013/0102142 | A1* | 4/2013 | Lee | H01L 21/823807 438/591 |
| 2014/0120711 | A1* | 5/2014 | Tsai | H01L 21/28088 438/592 |
| 2014/0264609 | A1* | 9/2014 | Fung | H01L 21/761 257/368 |
| 2014/0264610 | A1 | 9/2014 | Yang et al. | |
| 2015/0194505 | A1 | 7/2015 | Asenov et al. | |
| 2015/0200205 | A1* | 7/2015 | Cheng | H01L 21/823807 257/351 |
| 2016/0020154 | A1 | 1/2016 | Cheng et al. | |
| 2016/0056156 | A1* | 2/2016 | Ghani | H01L 21/82382 257/401 |
| 2016/0254261 | A1 | 9/2016 | Siddiqui | |

FOREIGN PATENT DOCUMENTS

| | | |
|---|---|---|
| WO | 2014039325 A1 | 3/2014 |
| WO | 2014062486 A1 | 4/2014 |
| WO | 2014098975 A1 | 6/2014 |
| WO | 2014159160 A1 | 10/2014 |

OTHER PUBLICATIONS

International Search Report and Written Opinion—PCT/US2016/012893—ISA/EPO—dated Apr. 12, 2016.
Marchi et al., "Top-Down Fabrication of Gate-All-Around Vertically Stacked Silicon Nanowire FETs With Controllable Polarity," IEEE Transactions on Nanotechnology IEEE Trans. Nanotechnology 13.6 (2014) : pp. 1029-1038.
Sharma A., et al., "Performance Analysis of Gate-All-Around Field Effect Transistor for CMOS Nanoscale Devices", International Journal of Computer Applications, Dec. 2013, vol. 84 No. 10, pp. 44-48.

* cited by examiner

ADJACENT DEVICE ISOLATION

CROSS REFERENCE TO RELATED APPLICATION

The present application is a divisional of U.S. patent application Ser. No. 14/633,011, filed on Feb. 26, 2015, and entitled "ADJACENT DEVICE ISOLATION," the disclosure of which is expressly incorporated by reference herein in its entirety.

BACKGROUND

Field

Aspects of the present disclosure relate to semiconductor devices, and more particularly to isolation between adjacent devices.

Background

As integrated circuit (IC) technology advances, device geometries are reduced. Reducing the geometry and "pitch" (spacing) between devices may cause devices to interfere with each other in terms of proper operation.

Fin-based devices are three-dimensional structures on the surface of a semiconductor substrate. A fin-based transistor, which may be a fin-based metal-oxide-semiconductor field-effect transistor (MOSFET), may be referred to as a FinFET. A nanowire field-effect transistor (FET) is also a three-dimensional structure on the surface of a semiconductor substrate. A nanowire FET includes doped portions of the nanowire that contact a channel region and serve as the source and drain regions of the device. A nanowire FET is also an example of a MOSFET device.

The performance of MOSFET devices can be affected by numerous factors including channel length, strain and external resistance. One substantial factor that contributes to the performance of MOSFET devices is interference between adjacent devices. Interference between adjacent devices is a device performance and scaling limiter for advanced technology nodes in which the geometry and pitch between devices is dramatically reduced.

SUMMARY

An integrated circuit (IC) device may include a first active transistor of a first-type in a first-type region. The first active transistor may have a first-type work function material and a low channel dopant concentration in an active portion of the first active transistor. The IC device may also include a first isolation transistor of the first-type in the first-type region. The second active transistor may have a second-type work function material and the low channel dopant concentration in an active portion of the first isolation transistor. The first isolation transistor may be arranged adjacent to the first active transistor.

A method for altering a work function material of an isolation transistor within an integrated circuit (IC) device is described. The method may include exposing a first-type work function material of the isolation transistor disposed adjacent to a first-type active transistor in a first-type region. The method may also include etching the first-type work function material of the isolation transistor to form a second-type work function material for the isolation transistor within the first-type region. The method may further include depositing a conductive fill material on the second-type work function material of the isolation transistor.

An integrated circuit (IC) device may include a first active transistor of a first-type in a first-type region. The first active transistor may have a first-type work function material and a low channel dopant concentration in an active portion of the first active transistor. The IC device may also include a first means for isolating the first active transistor. The first isolating means may be arranged adjacent to the first active transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
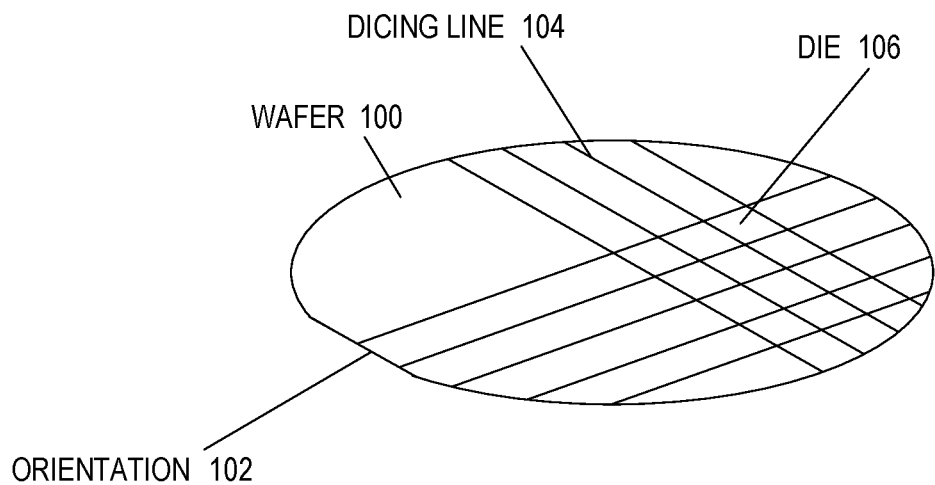
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front-end-of-line (FEOL), a middle-of-line (MOL) and a back-end-of-line (BEOL). Front-end-of-line processes include wafer preparation, isolation, well formation, gate patterning, spacers, and dopant implantation. A middle-of-line process includes gate and terminal contact formation. The gate and terminal contact formation of the middle-of-line process, however, is an increasingly challenging part of the fabrication flow, particularly for lithography patterning. Back-end-of-line processes include forming interconnects and dielectric layers for coupling to the FEOL devices. Formation of the FEOL devices may involve isolation of adjacent devices to reduce neighboring device interference.

As integrated circuit (IC) technology advances, device geometries are reduced. The geometry and "pitch" (spacing) between devices has substantially reduced in advanced logic technology. For example, in a seven (7) nanometer logic technology, the fin pitch is highly scaled (e.g., 21 to 24 nanometers) and the contacted gate pitch is also aggressively reduced (e.g., 39 to 45 nanometers).

Fin-based devices represent a significant advance in IC technology. Fin-based devices are three-dimensional structures on the surface of a semiconductor substrate. A fin-based transistor, which may be a fin-based metal-oxide-semiconductor field-effect transistor (MOSFET), may be referred to as a FinFET. A nanowire field-effect transistor (FET) also represents a significant advance in IC technology. A gate-all-around (GAA) nanowire-based device is also a three-dimensional structure on the surface of a semiconductor substrate. A GAA nanowire-based device includes doped portions of the nanowire that contact a channel region and serve as the source and drain regions of the device. A GAA nanowire-based device is also an example of a MOSFET device.

The performance of MOSFET devices can be affected by numerous factors including channel length, strain and external resistance. For example, semiconductor device operation often involves isolating one device from another. As a result, interference between adjacent devices is one substantial factor that may contribute to degraded performance of MOSFET devices. In particular, interference between adjacent devices is a device performance and scaling limiter for advanced technology nodes in which the geometry and spacing between devices is dramatically reduced.

In a planar structure, a fin-based structure, a GAA nanowire-based structure or other like three-dimensional structures, adjacent devices, such as transistors, may be physically and/or electrically isolated. A physical disconnect between adjacent active areas may be performed to disconnect the active areas of adjacent transistors. The disconnection may involve physically breaking the active areas using, for example, a cutting step to disconnect the active areas of adjacent transistors or some other physical barrier between two adjacent devices. While such an approach may provide complete electrical isolation, the physical disconnection (e.g., the cutting step) is not self-aligned. Lack of self-alignment in the physical disconnection may lead to performance variability, while involving a device area penalty to account for the physical barrier created between the two adjacent devices.

An electrical disconnect between adjacent active areas may be performed to electrically disconnect the active area of an adjacent isolation device. In this electrical isolation, a nearby (or adjacent) transistor may be used as an isolation device. Such an isolation device may be referred to as a "tie-off" device in which the active area of the tie-off device is set to an off state. An off state may be different depending on the type of charge carrying device. For example, in an n-type device, the tie-off device may tie a gate to a low potential, whereas for a p-type device the tie-off device may tie the gate to a high potential. A gate of an isolation transistor (e.g., a tie-off device) may be biased to place the isolation transistor in an OFF state and provide isolation for an adjacent active device.

In related art approaches, the tie-off device (e.g., the gate of a transistor) may be of the same charge carrier as the desired active device. In such cases, the tie-off device may be fabricated using similar processing steps to those used to fabricate active devices. That is, the processing steps used to fabricate the gate, source and drain, as well as the gate contacts for the tie-off device, and the characteristics (e.g., threshold voltage (Vt), leakage current $I_{off}$, gate length, etc.) of the tie-off device will be similar to those used to fabricate the active device. For example, if the active device is a high performance device, a threshold voltage (Vt) of the active device may be low. As a result, the isolation device is also fabricated with a low threshold voltage. Without physical disconnection, a non-negligible leakage current $I_{off}$ will exist across the isolation device because of the low threshold voltage (e.g., the voltage low above which the device is activated).

Various aspects of the disclosure provide techniques for isolating adjacent devices by altering a work function material of the isolation device. The process flow for altering a work function material of either an active device or an isolation device may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" or may refer to a substrate of a diced wafer or may refer to the substrate of a wafer that is not diced. Similarly, the terms wafer and die may be used interchangeably unless such interchanging would tax credulity.

Aspects of the present disclosure include an innovative integration flow to alter a work function material disposed on the active source/drain regions of either a fin-based active device or a fin-based isolation device. Additional aspects of the present disclosure can alter a work function material disposed on the active source/drain regions of gate-all-around (GAA) nanowire-based devices and other like three-dimensional structure to reduce leakage current within the isolation device. Adjacent device isolation using altered work function materials may enable operation within the reduced device geometries of advanced logic technology, such as seven (7) nanometer logic technology and beyond. A work function alteration is self-aligned to the active devices and may be performed using existing materials and process capabilities with no additional steps. This aspect of the present disclosure also provides a reduction in the fabrication penalty for forming an isolation device within the active circuit area.

One aspect of the present disclosure alters the work function material of either the active device or the tie-off device, such that the active device and the corresponding tie-off device have different work function materials. For high performance active devices, which have a low threshold voltage, having a similar work-function material (e.g., a p-type work function metal (PWFM) or an n-type work function metal (NWFM)) in the corresponding tie-off device increases the possibility of leakage current. By altering the work function material of the either active device or the tie-off device, which may be done in the gate stack, the threshold of the tie-off device is changed from a lower threshold voltage to a higher threshold voltage. This may change the leakage current and also may provide isolation between the active device and other active devices, such as adjacent active devices on an integrated circuit.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
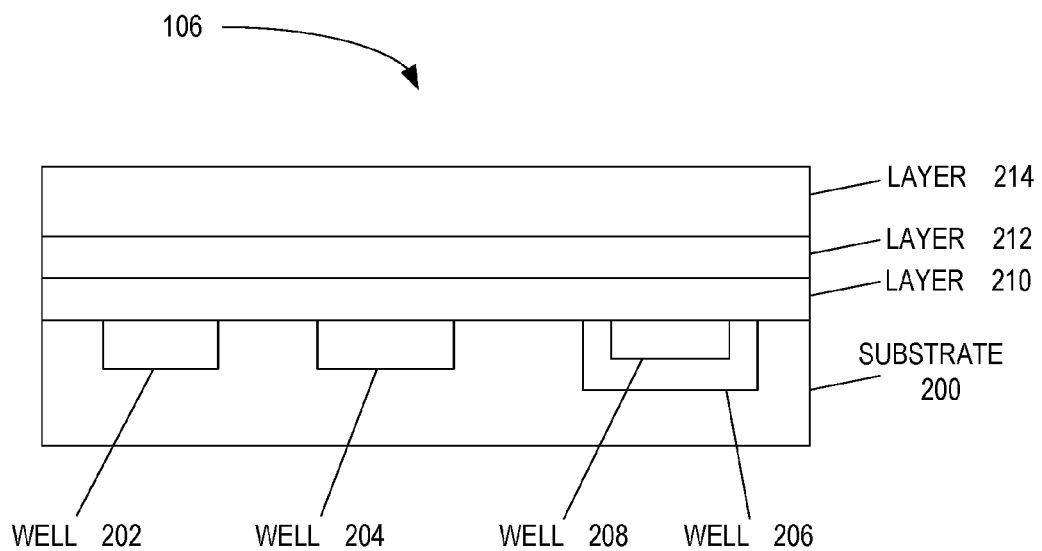
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
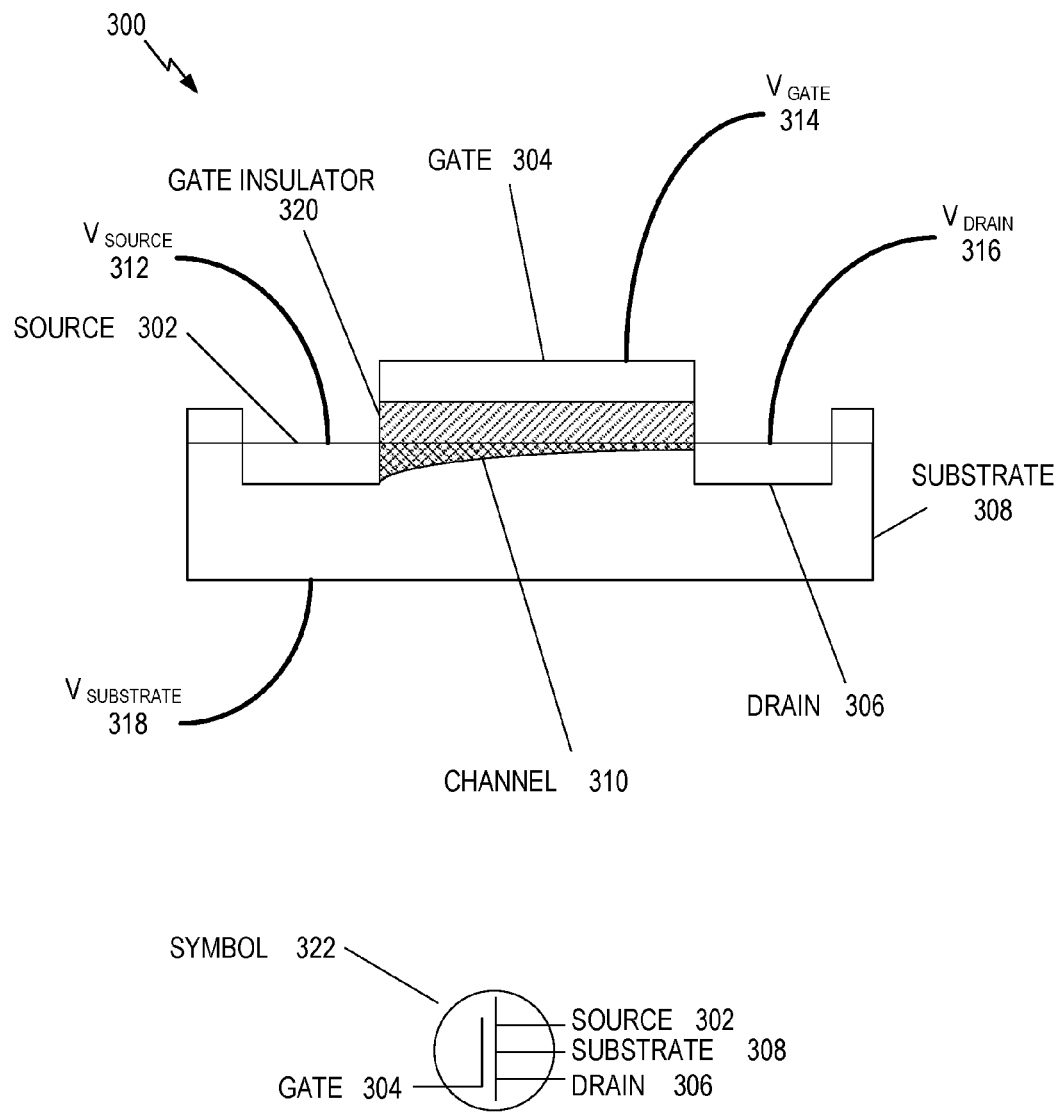
FIG. 3 illustrates a cross-sectional view of a metal-oxide-semiconductor field-effect transistor (MOSFET) device in an aspect of the present disclosure.

FIG. 3 illustrates a cross-sectional view of a metal-oxide-semiconductor field-effect transistor (MOSFET) device 300 in an aspect of the present disclosure. The MOSFET device 300 may have four input terminals. The four inputs are a source 302, a gate 304, a drain 306, and a substrate 308. The source 302 and the drain 306 may be fabricated as the wells 202 and 204 in the substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die 106 (e.g., semiconductor), interconnect traces or layers are used. These interconnect traces may be in one or more of layers (e.g., 210-214), or may be in other layers of the die 106.

Figure 4:
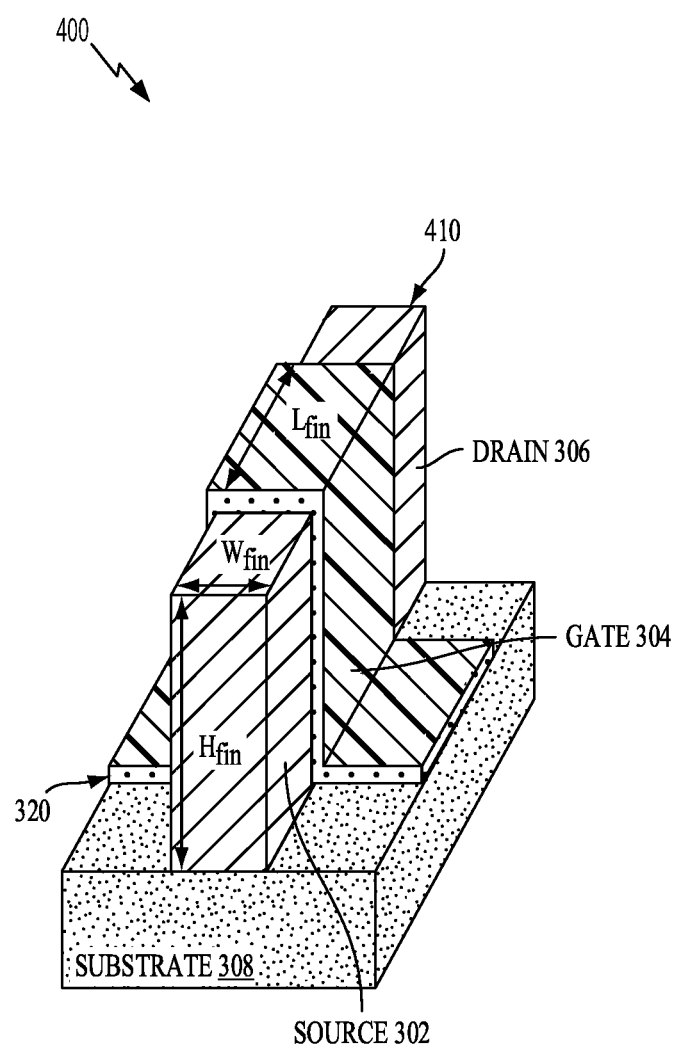
FIG. 4 illustrates a fin field-effect transistor (FinFET) in accordance with an aspect of the present disclosure.

FIG. 4 illustrates a transistor in accordance with an aspect of the present disclosure. A fin-structured FET (FinFET 400) operates in a similar fashion to the MOSFET device 300 described with respect to FIG. 3. A fin 410 in a FinFET 400, however, is grown or otherwise coupled to the substrate 308. The substrate 308 may be a semiconductor substrate or other like supporting layer, for example, comprised of an oxide layer, a nitride layer, a metal oxide layer or a silicon layer. The fin 410 includes the source 302 and the drain 306. A gate 304 is disposed on the fin 410 and on the substrate 308 through a gate insulator 320. A height, Hfin, a width, Wfin, and a length, Lfin, represent the dimensions of the fin. In a FinFET structure, the physical size of the FinFET 400 may be smaller than the MOSFET device 300 structure shown in FIG. 3. This reduction in physical size allows for more devices per unit area on the die 106.

Adjacent Device Isolation with Adjusted Work Function

As integrated circuit (IC) technology advances, device geometries are reduced. The geometry and "pitch" (spacing) between devices has substantially reduced in advanced logic technology. For example, in a seven (7) nanometer logic technology, the fin pitch is highly scaled (e.g., 21 to 24 nanometers) and the contacted gate pitch is also aggressively reduced (e.g., 39 to 45 nanometers).

Fin-based devices represent a significant advance in IC technology. Fin-based devices are three-dimensional structures on the surface of a semiconductor substrate. A fin-based transistor, which may be a fin-based metal-oxide-semiconductor field-effect transistor (MOSFET), may be referred to as a FinFET. A nanowire field-effect transistor (FET) also represents a significant advance in IC technology. A gate-all-around (GAA) nanowire-based device is also a three-dimensional structure on the surface of a semiconductor substrate. A GAA nanowire-based device includes doped portions of the nanowire that contact a channel region and serve as the source and drain regions of the device. A GAA nanowire-based device is also an example of a MOSFET device.

The performance of MOSFET devices can be affected by numerous factors including channel length, strain and external resistance. For example, semiconductor device operation often involves isolating one device from another. As result, interference between adjacent devices is one substantial factor that may contribute to degraded performance of MOSFET devices. In particular, interference between adjacent devices is a device performance and scaling limiter for advanced technology nodes in which the geometry and spacing between devices is dramatically reduced.

In a planar structure, a fin-based structure, a GAA nanowire-based structure or other like three-dimensional structures, adjacent devices, such as transistors, may be physically and/or electrically isolated. A physical disconnect between adjacent active areas may be performed to disconnect the active areas of adjacent transistors. The disconnection may involve physically breaking the active areas using, for example, a cutting step to disconnect the active areas of adjacent transistors or some other physical barrier between two adjacent devices. While such an approach may provide complete electrical isolation, the physical disconnection (e.g., the cutting step) is not self-aligned. Lack of self-alignment in the physical disconnection may lead to performance variability, while avoiding a device area penalty to account for the physical barrier created between the two adjacent devices.

An electrical disconnect between adjacent active areas may be performed to electrically disconnect the active area of an adjacent isolation device. In this electrical isolation, a nearby (or adjacent) transistor may be used as an isolation device. Such an isolation device may be referred to as a "tie-off" device in which the active area of the tie-off device is set to an off state. An off state may be different depending on the type of charge carrying device. For example, in an n-type device, the tie-off device may tie a gate to a low potential, whereas for a p-type device the tie-off device may tie the gate to a high potential.

In related art approaches, the tie-off device (e.g., the gate of a transistor) may be of the same charge carrier as the desired active device. In such cases, the tie-off device may be fabricated using similar processing steps to those used to fabricate active devices. That is, the processing steps used to fabricate the gate, source and drain, as well as the gate contacts for the tie-off device, and the characteristics (e.g., threshold voltage (Vt), leakage current $I_{off}$, gate length, etc.) of the tie-off device will be similar to those used to fabricate the active device. For example, if the active device is a high performance device, a threshold voltage (Vt) of the active device may be low. As a result, the isolation device is also fabricated with a low threshold voltage. Without physical disconnection, a non-negligible leakage current $I_{off}$ will exist across the isolation device because of the low threshold voltage (e.g., the voltage low above which the device is activated).

Various aspects of the disclosure provide techniques for isolating adjacent devices by altering a work function material of either the active device or the isolation device. The process flow for altering a work function material of either an active device or an isolation device may include front-end-of-line (FEOL) processes, middle-of-line (MOL) processes, and back-end-of-line (BEOL) processes.

Aspects of the present disclosure include an innovative integration flow to alter a work function material disposed on the active source/drain regions of either a fin-based active device or a fin-based isolation device. Additional aspects of the present disclosure can alter a work function material disposed on the active source/drain regions of gate-all-around (GAA) nanowire-based devices and other like three-dimensional structure to reduce leakage current within the isolation device. Adjacent device isolation using altered work function materials may enable operation within the reduced device geometries of advanced logic technology, such as seven (7) nanometer logic technology and beyond. A work function alteration is self-aligned to the active devices and may be performed using existing materials and process capabilities with no additional steps. This aspect of the present disclosure also provides a reduction in the fabrication penalty for forming an isolation device within the active circuit area.

One aspect of the present disclosure alters the work function material of either the active device or the tie-off device, such that the active device and the corresponding tie-off device have different work function materials. For high performance active devices, which have a low threshold voltage, having a similar work-function material (e.g., a p-type work function metal (PWFM) or an n-type work function metal (NWFM)) in the corresponding tie-off device increases the possibility of leakage current. By altering the work function material of the either active device or the tie-off device, which may be done in the gate stack, the threshold voltage of the tie-off device is modified from a lower threshold voltage to a higher threshold voltage. This may reduce the leakage current, while providing isolation between the active device and other active devices, such as adjacent active devices on an integrated circuit, without relying on physical isolation.

Figure 5:
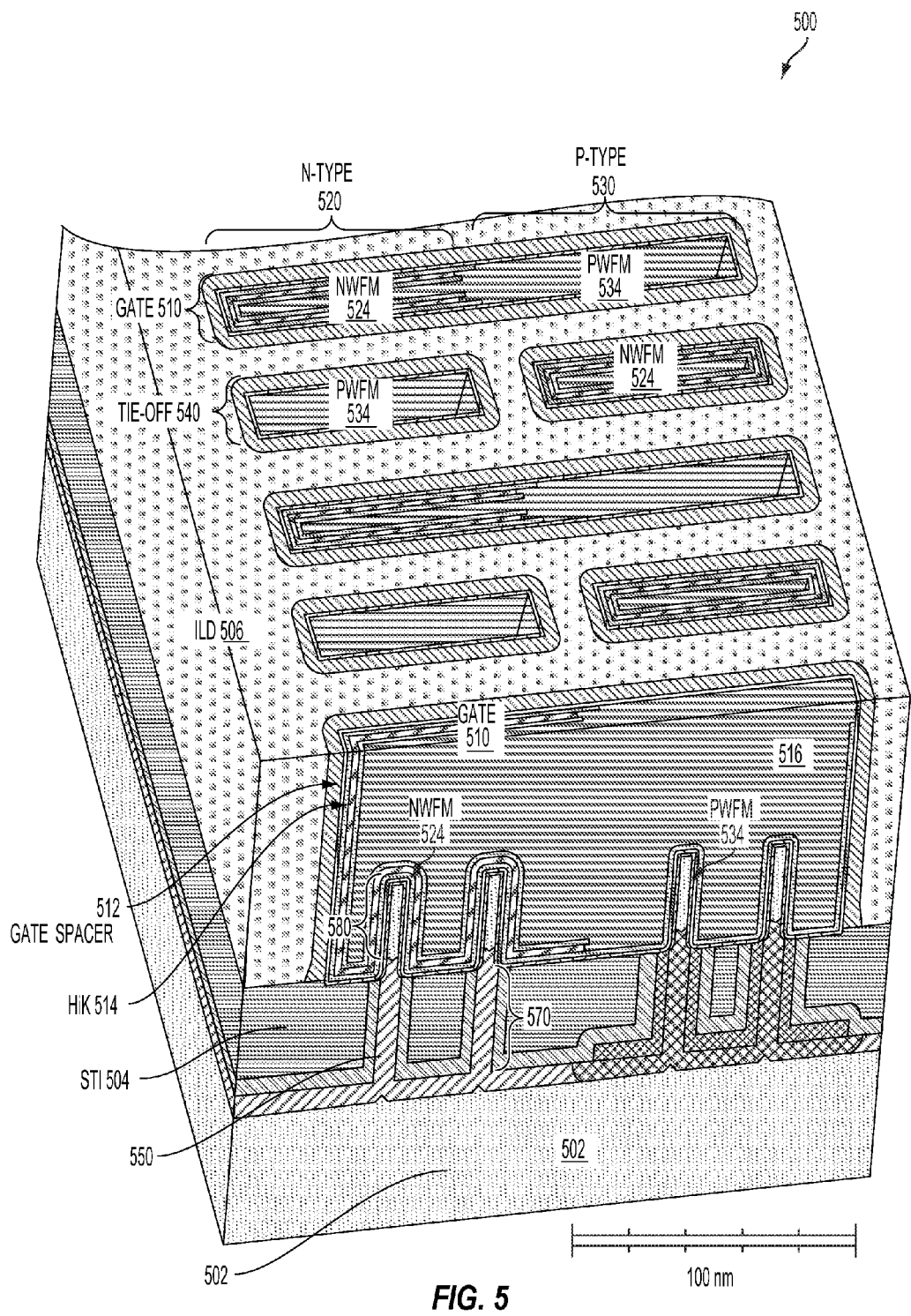
FIG. 5 illustrates a perspective view of an integrated circuit (IC) device in which adjacent devices are isolated by altering a work function material of the isolation devices according to an aspect of the present disclosure.

FIG. 5 illustrates a cross-sectional view of a fin-based integrated circuit (IC) device 500 including altered work function material within an isolation device in accordance with an aspect of the present disclosure. Representatively, the fin-based IC device 500 includes a shallow trench isolation (STI) region 504 surrounding the fins 550 including doped sub-fin portions 570 and active fin portions 580 supported by a substrate 502 (e.g., a semiconductor substrate, a silicon on insulator (SOI) substrate, a buried oxide (BOX) layer, or the like). An SOI substrate may be fully depleted. Each of the active fin portions 580 is disposed on one of the doped sub-fin portions 570 (e.g. the doped portions of the fins 550). When the doped sub-fin portions 570 are of an n-type (e.g., an NFET), the doped sub-fin portions 570 are composed of phosphorous doped silicon (SiP), carbon phosphorous doped silicon (SiCP), phosphorous doped silicon germanium (SiGeP), phosphorous doped germanium (GeP), or other like three/five (III/V) material. When the doped sub-fin portions 570 are of a p-type (e.g., a PFET), the doped sub-fin portions 570 are composed of boron doped silicon germanium (SiGeB), boron doped germanium (GeB), or other like doped material.

In this arrangement, the fin-based IC device 500 includes active devices (e.g., active gates 510) and isolation devices (e.g., tie-off gates 540). The active gates 510 include a first portion within an n-type region 520 having an n-type work function material (NWFM) 524. The active gates 510 also include a second portion within a p-type region 530 having a p-type work function material (PWFM) 534. Similarly, the tie-off gates 540 may be formed within the n-type region 520 or the p-type region 530. In this aspect of the disclosure, however, the work function material of the tie-off gates 540 is altered.

For example, although one of the tie-off gates 540 is in the n-type region 520, the work function material is of the p-type work function material (e.g., PWFM 534). Likewise, although the other of the tie-off gates 540 is in the p-type region 530, the work function material is of the n-type work function material (e.g., NWFM 524). In this aspect of the disclosure, altering the work function material of the tie-off gates 540 changes the threshold of the tie-off device from a lower threshold voltage to a higher threshold voltage. This may reduce the leakage current while providing improved electrical isolation between the active device and other active devices without relying on physical disconnection of the isolation devices.

In this arrangement, the active gates 510 include a gate spacer 512 (e.g., a nitride-based low-K gate spacer) on sidewalls of the active gates 510. A conductive fill material 516 (e.g., tungsten (W) or cobalt (Co)) is disposed on the work function material (e.g., NWFM 524 or PWFM 534) of the active fin portions 580. The work function materials (e.g., NWFM 524 or PWFM 534) are deposited on a high-k dielectric layer 514 on the gate spacer 512. The fin-based IC device 500 may be formed as shown in FIGS. 6A-6J and 7A-7I. An IC device, according to aspects of the present disclosure, may include gate-all-around (GAA) nanowire-based active devices, fin-based active devices, or other like three-dimensional active devices. A process for forming the fin-based IC device 500, as shown in FIGS. 6A-7I, is described with reference to FIGS. 10A and 10B.

Figure 6A:
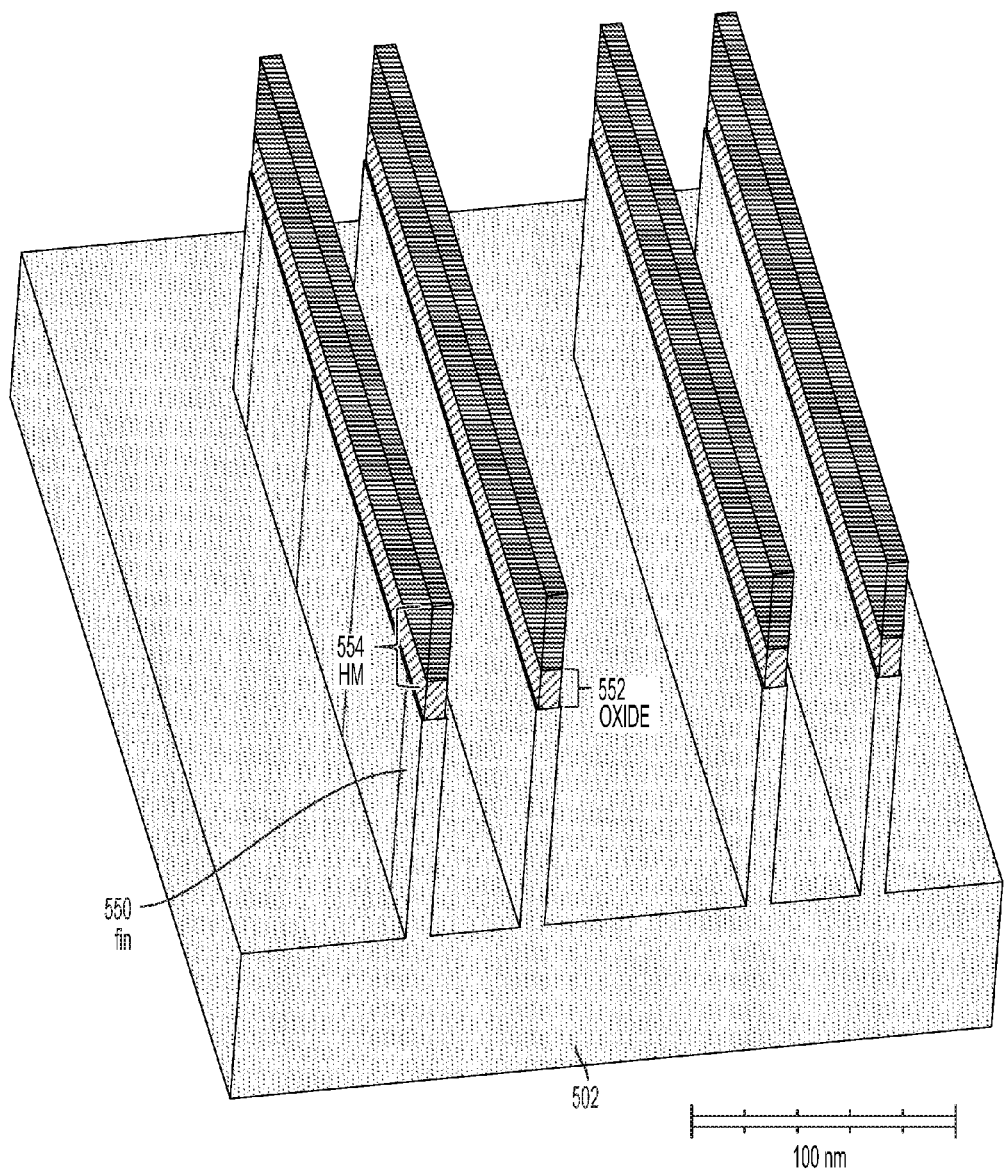
FIGS. 6A-6J are cross-sectional views illustrating isolation of sub-fin regions of the integrated circuit (IC) device of FIG. 5 in accordance with an aspect of the present disclosure.
Figure 8:
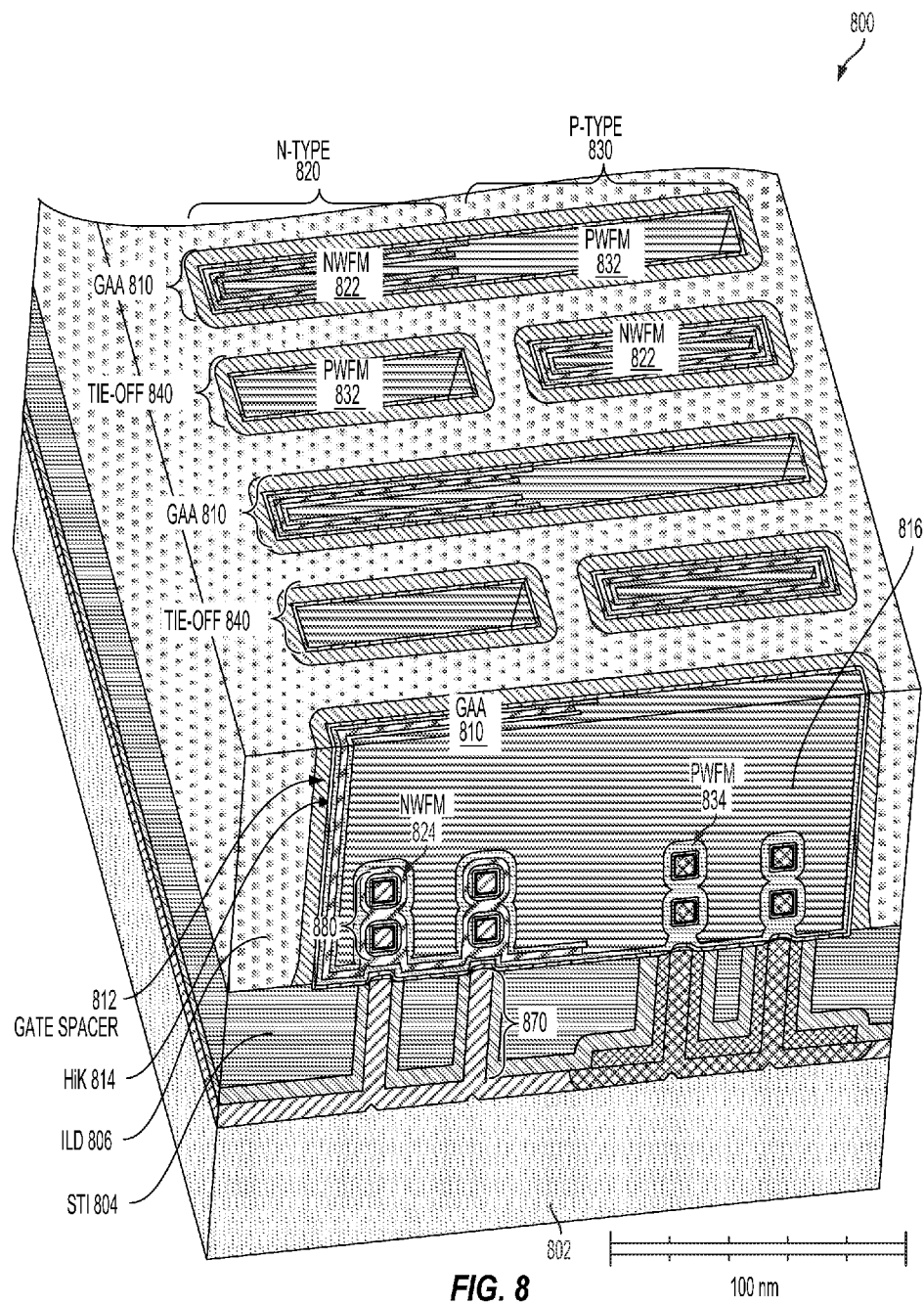
FIG. 8 illustrates a perspective view of an integrated circuit (IC) device in which adjacent devices are isolated by altering a work function material of the isolation devices according to an aspect of the present disclosure.
Figure 9:
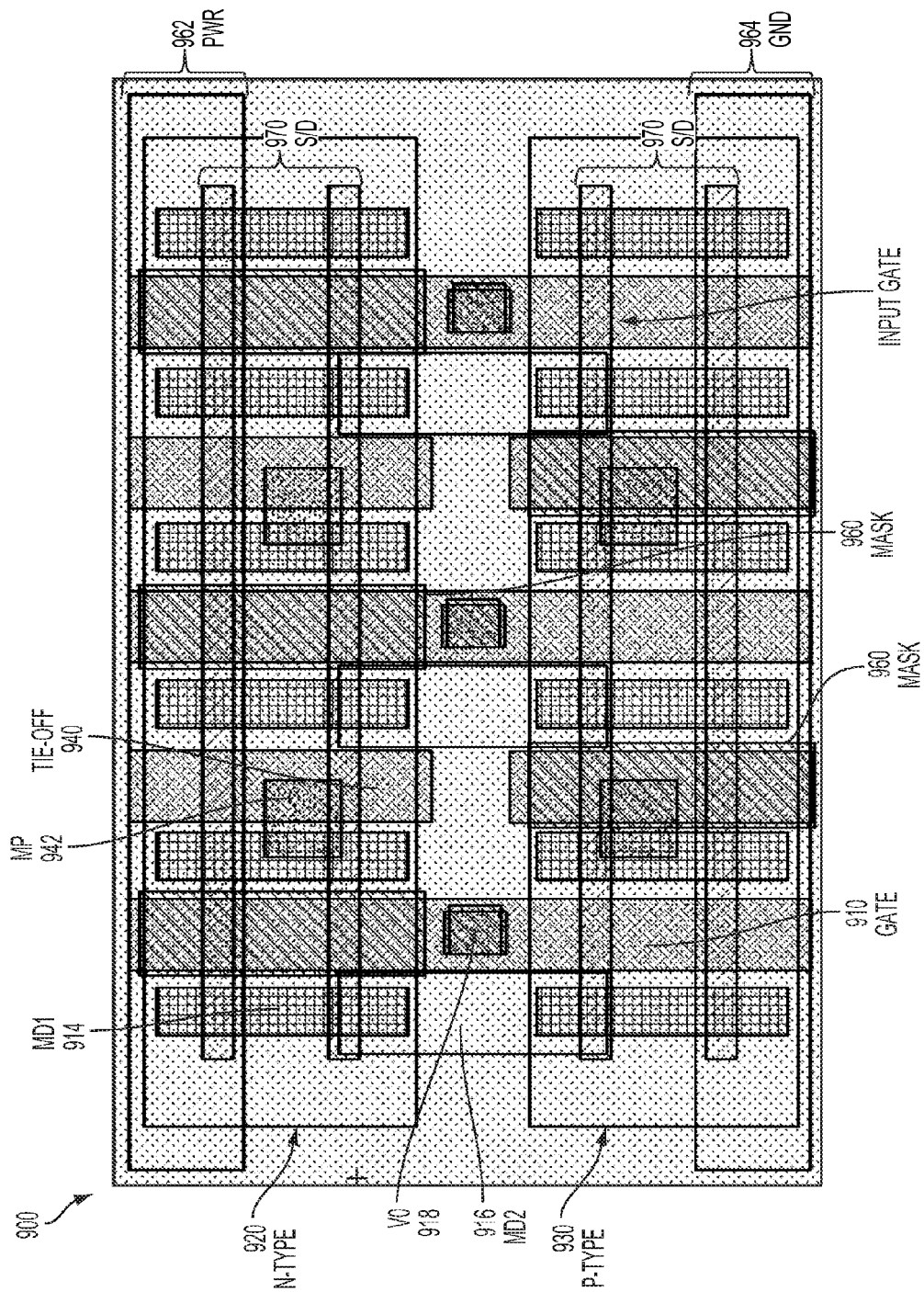
FIG. 9 illustrates a layout view of an integrated circuit (IC) device in which adjacent devices are isolated by altering a work function material of isolation devices according to an aspect of the present disclosure.
Figure 10A:
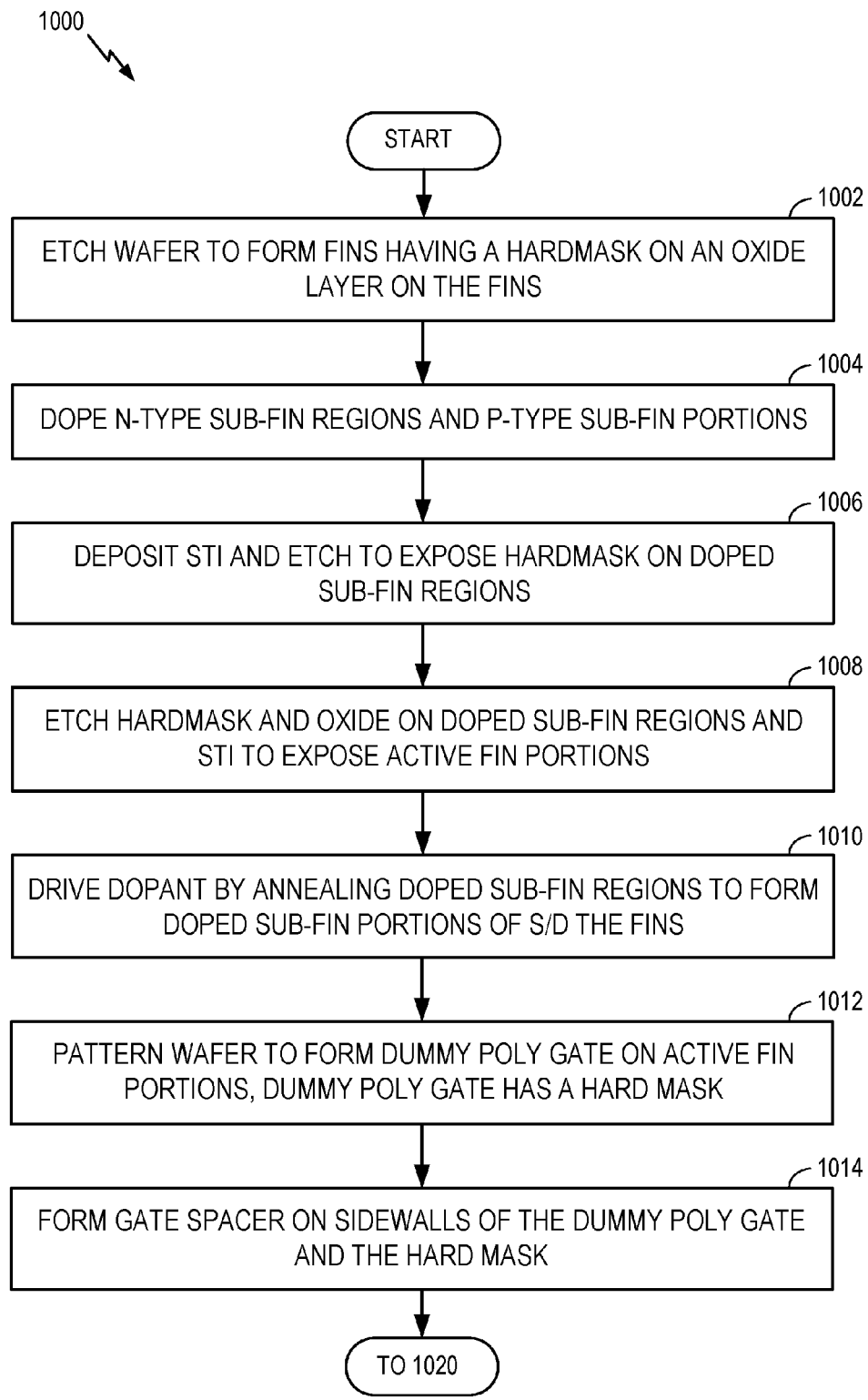
FIGS. 10A and 10B illustrate a method for fabricating an integrated circuit (IC) device in which adjacent devices are isolated by altering a work function material of isolation devices in accordance with an aspect of the present disclosure.

FIG. 10A illustrates a method 1000 for fabricating an IC device including isolation devices having an altered work function material according to an aspect of the present disclosure. The process described in FIGS. 10A and 10B enables formation of the fin-based IC device 500, as shown in FIGS. 5, 8 and 9. In block 1002, an incoming wafer (e.g., a semiconductor substrate) is shown after the wafer etch is completed to form fins 550. For example, as shown in FIG. 6A, a hardmask 554 (e.g., silicon nitride (SiN) and an oxide layer 552 are arranged on fins 550 (e.g., a base fin portion). Although illustrated with reference to a fin-based device, alteration of the work function material may be applied to other like three-dimensional semiconductor structures, such as the GAA nanowire-based IC device shown in FIG. 8.

Figure 6B:
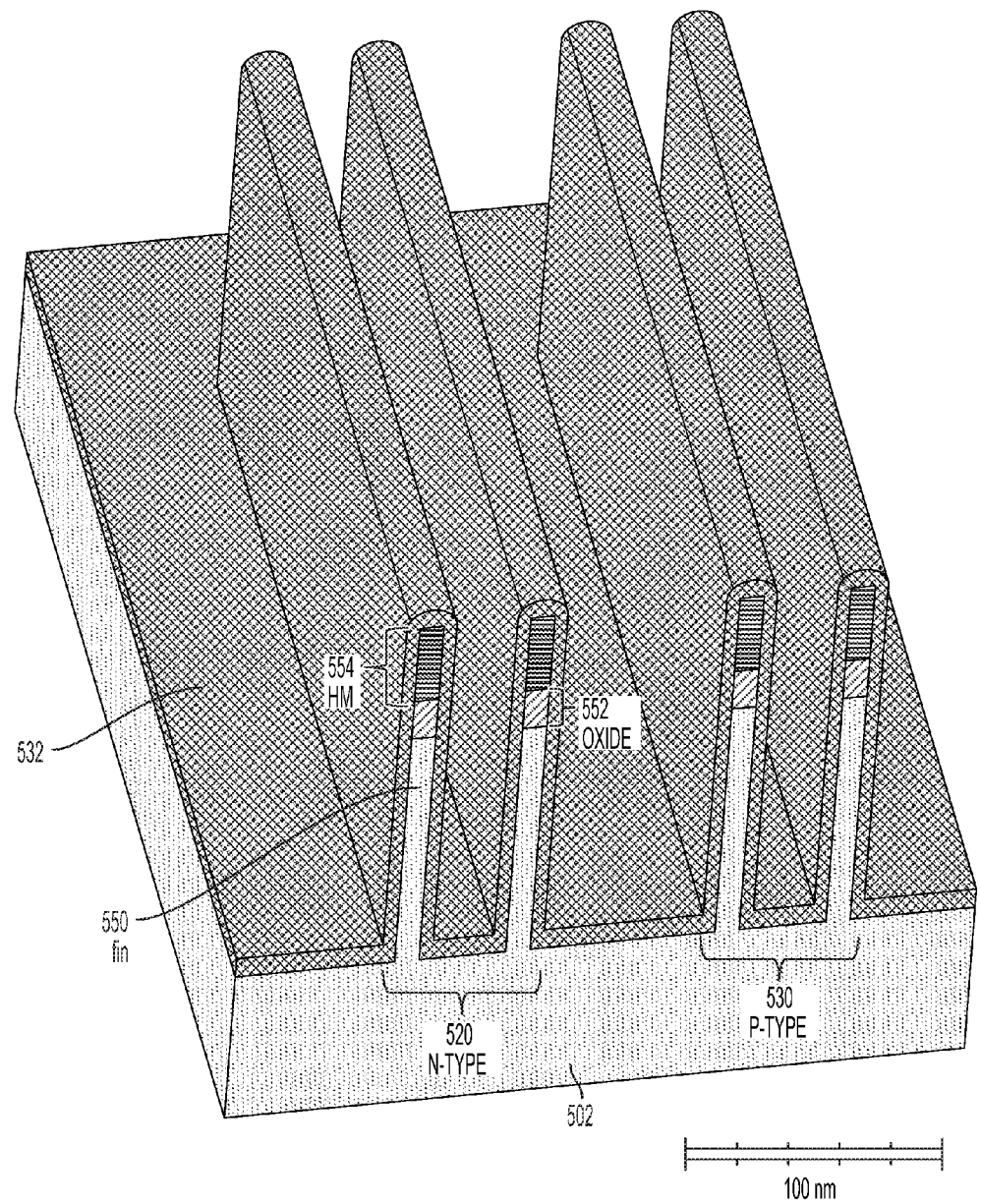
Figure 6C:
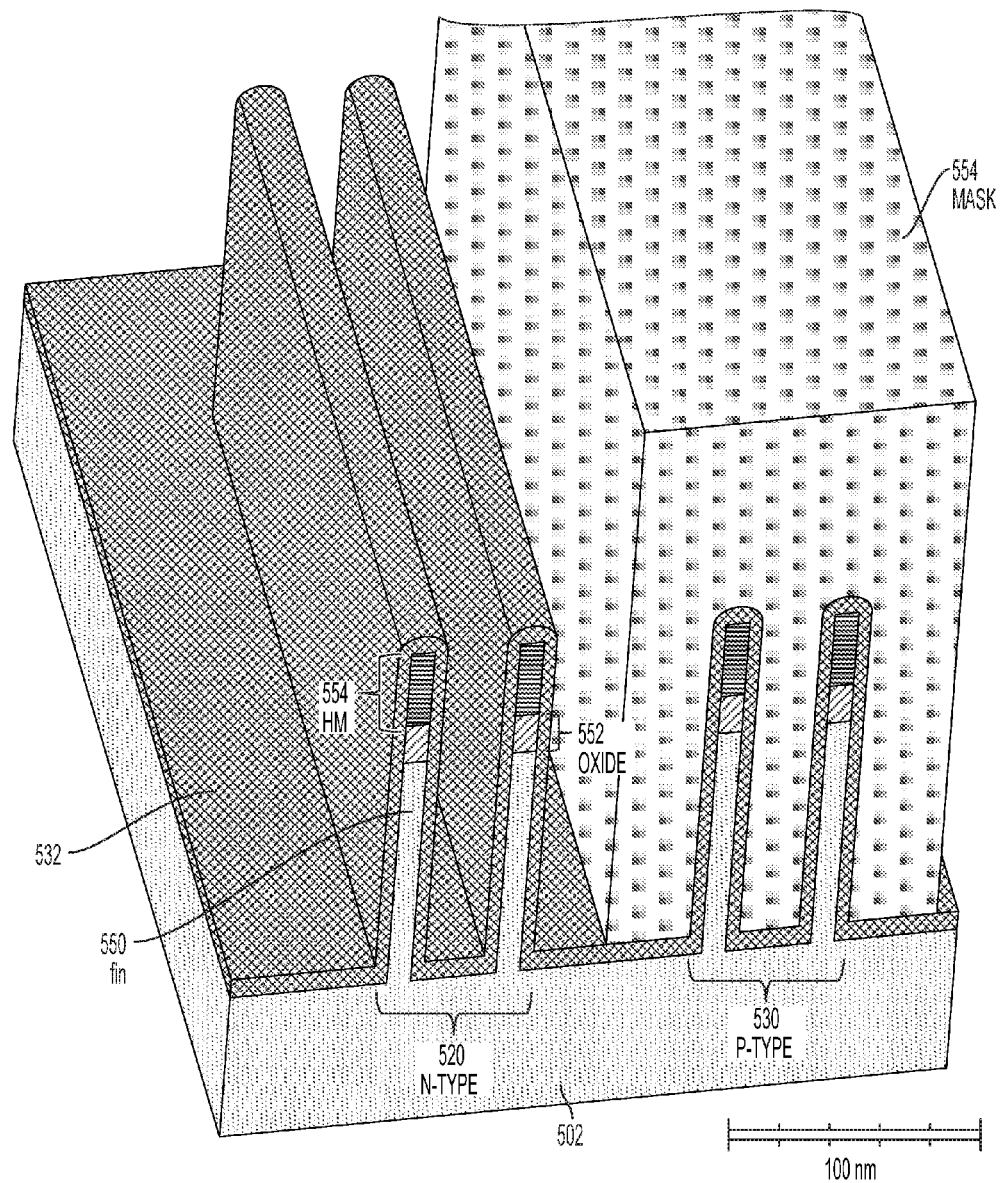
Figure 6D:
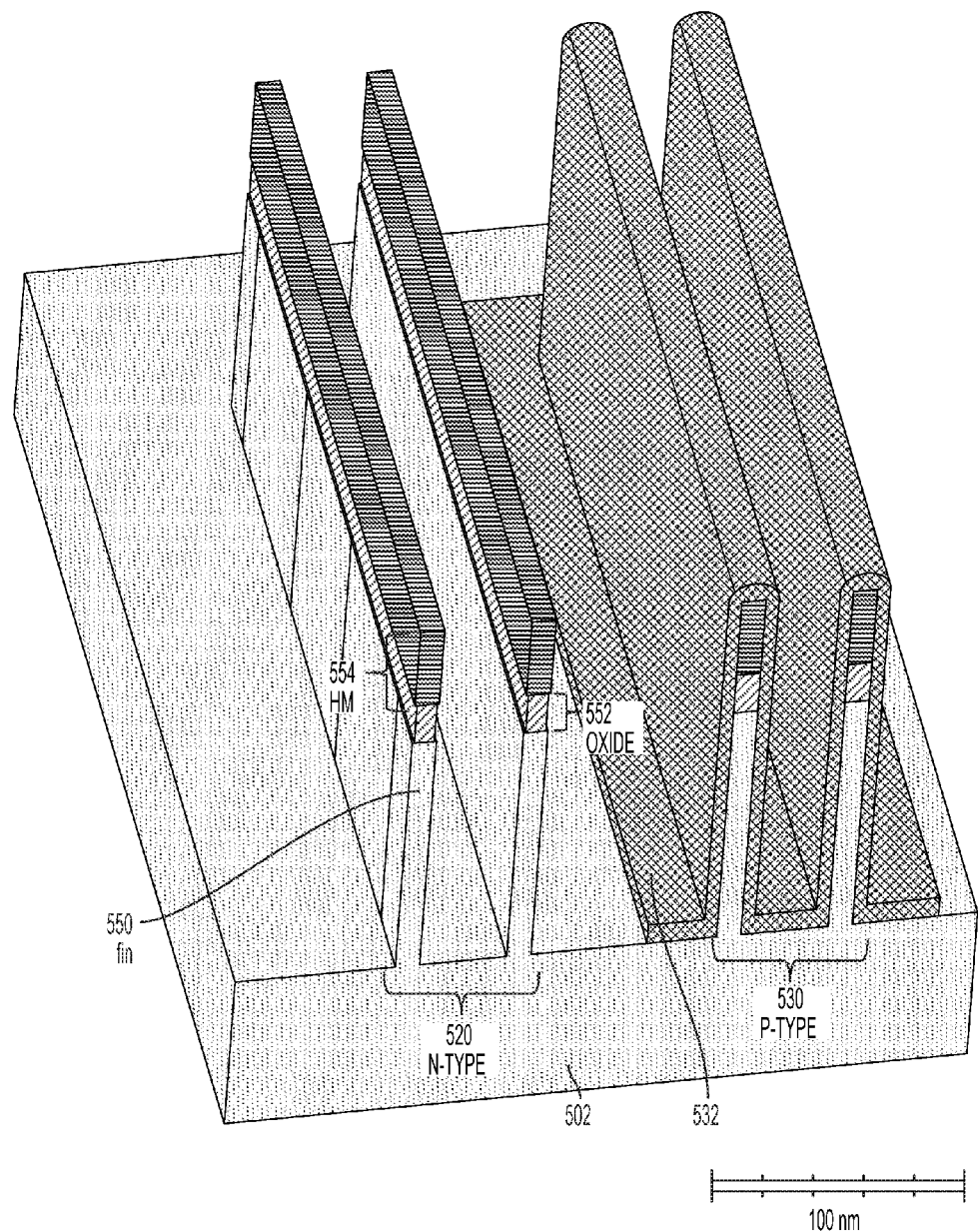

Referring again to FIG. 10A, in block 1004, the n-type sub-fin regions and the p-type sub-fin regions of the IC device are doped. For example, as shown in FIG. 6B, a p-type doped oxide 532 (e.g., boron) is formed on sidewalls of the fins 550, the oxide layer 552, and the hardmask 554 within both the n-type region 520 and the p-type region 530. In FIG. 6C, a hardmask 554 is deposited on the p-type doped oxide 532 within the p-type region 530. In FIG. 6D, the p-type doped oxide 532 is removed from the n-type region 520 to expose one of the fins 550; the p-type doped oxide 532 remains on the fins 550 in the p-type region 530.

Figure 6E:
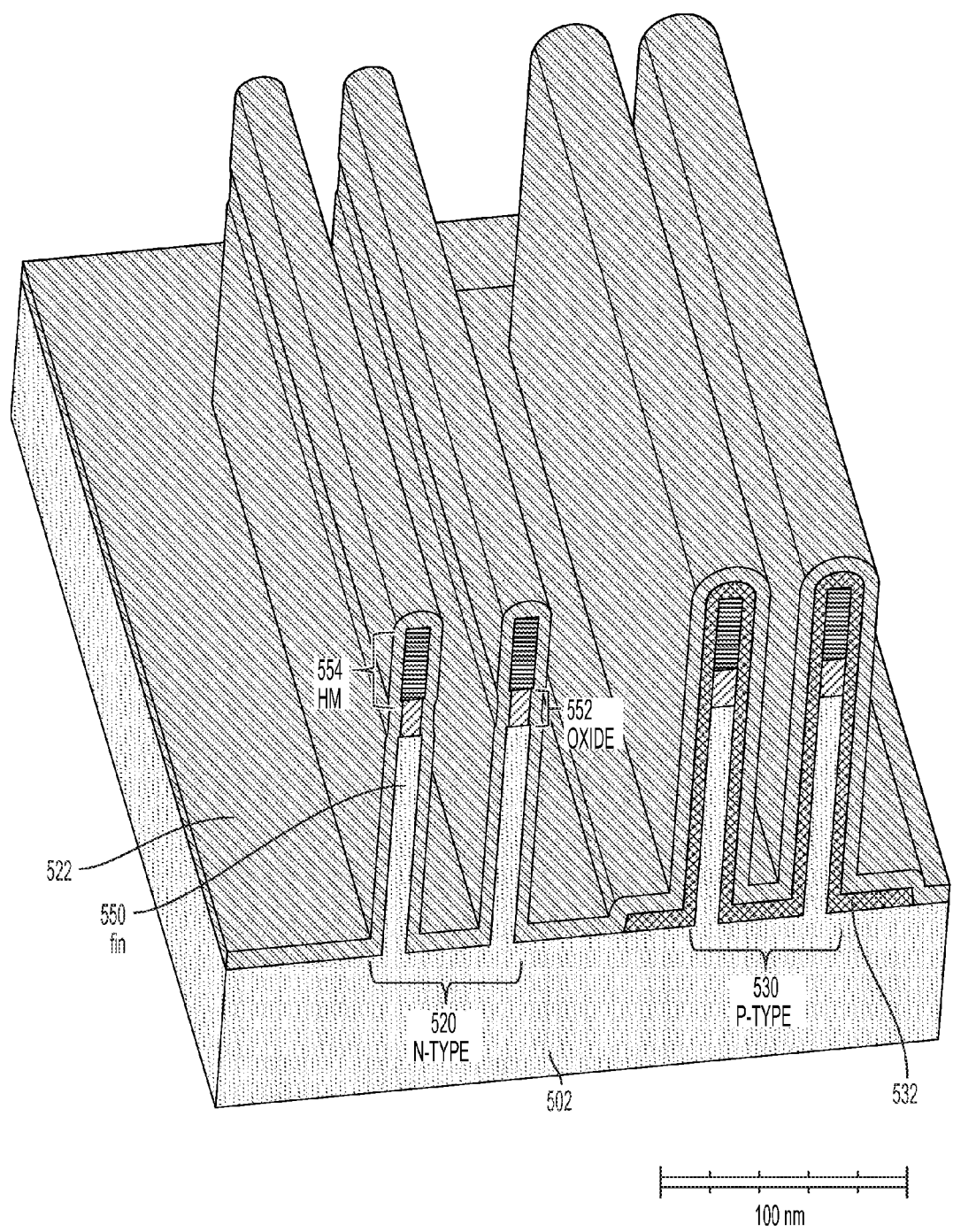

In FIG. 6E, an n-type doped oxide 522 (e.g., phosphorous or arsenic) is formed on sidewalls of the fins 550, the oxide layer 552, and the hardmask 554 within the n-type region 520. In addition, the n-type doped oxide 522 is deposited on the p-type doped oxide 532 within the p-type region 530. The process shown in FIGS. 6B-6E may be performed using a solid state dopant or other like well dopant. This technique avoids ion implantation into the wells of the device while reducing sub fin leakage. Fin channel doping is eliminated by not performing well ion implantation. In one aspect of the present disclosure, a well dopant is used to replace the well implants by positioning well dopants underneath the channel. In this aspect of the present disclosure, the active device as well as the isolation device exhibit a low channel dopant concentration in an active portion of the device. The dopant may be grown using an epitaxial process. Alternatively, the dopant may be a solid state dopant or other like well dopant that is positioned underneath the channel to replace ion implantation within the wells of the device.

Figure 6F:
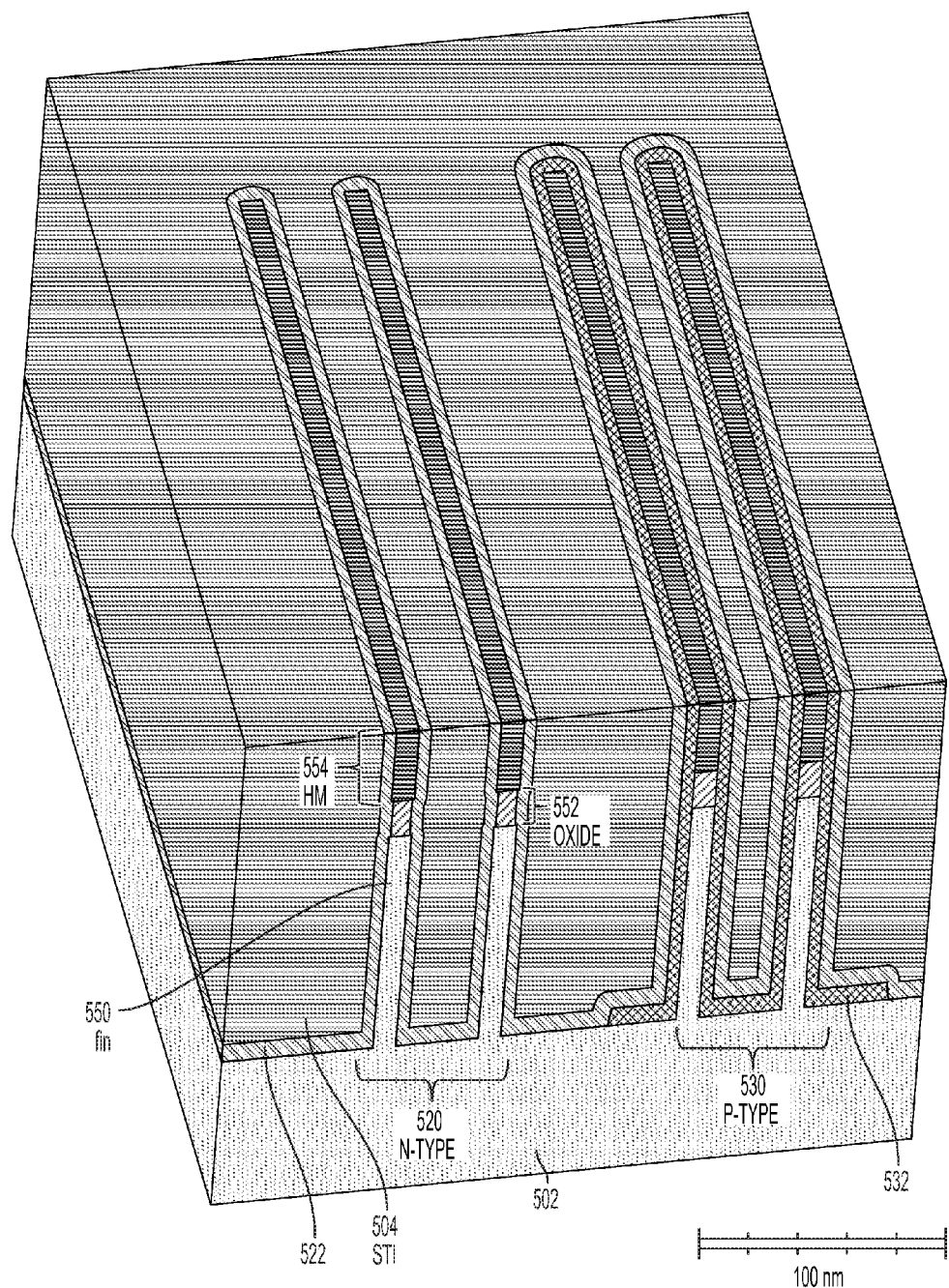
Figure 6G:
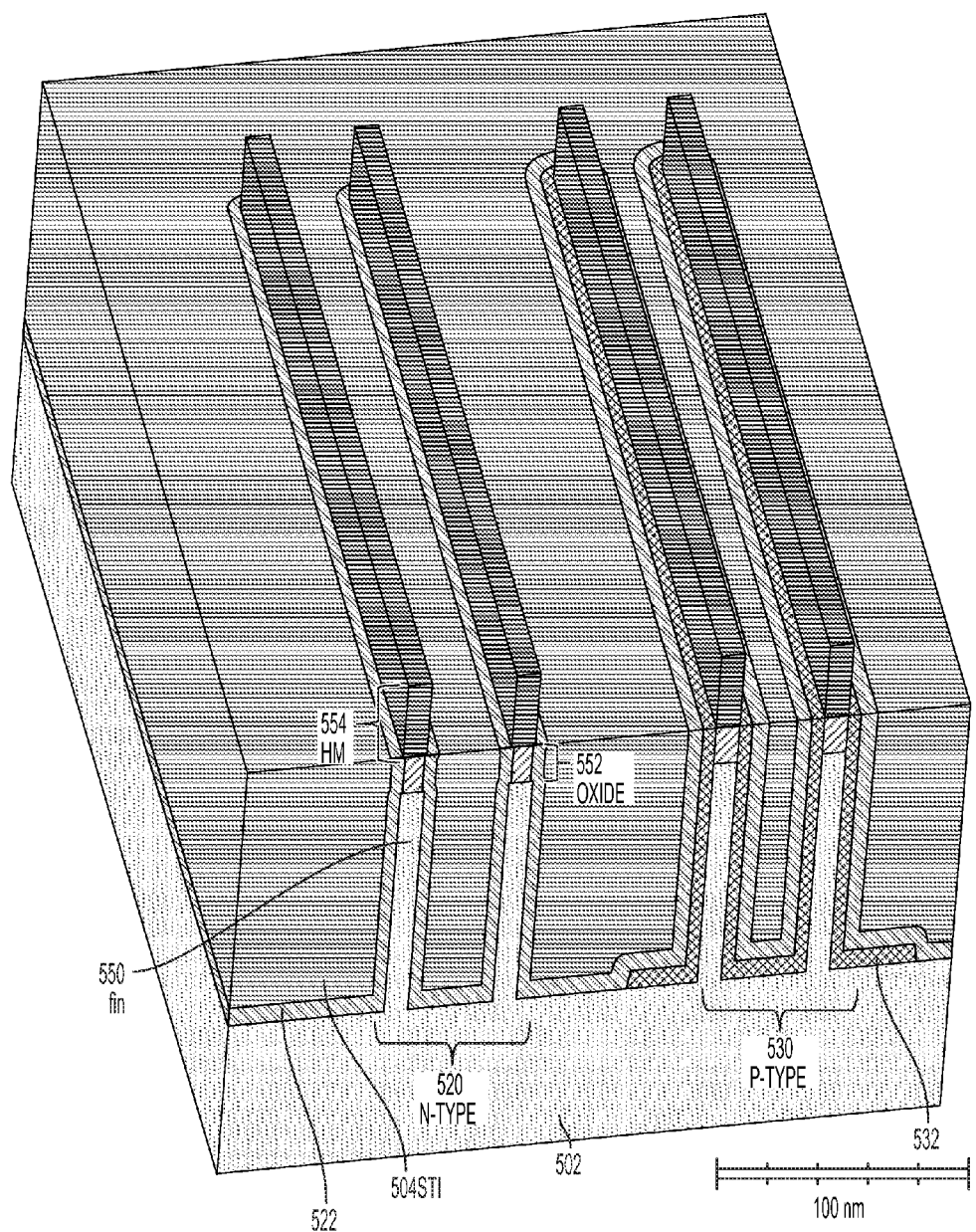
Figure 6H:
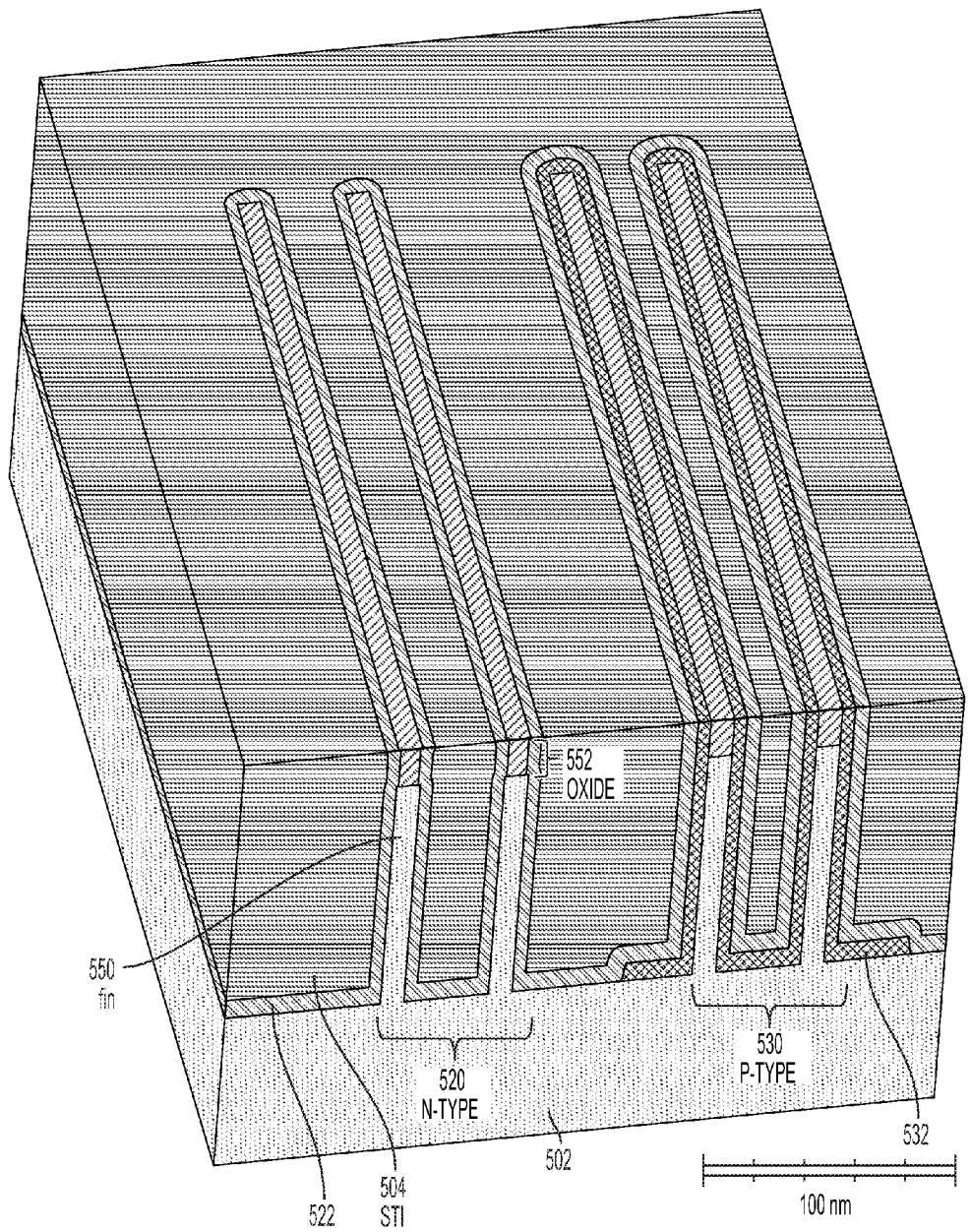
Figure 6I:
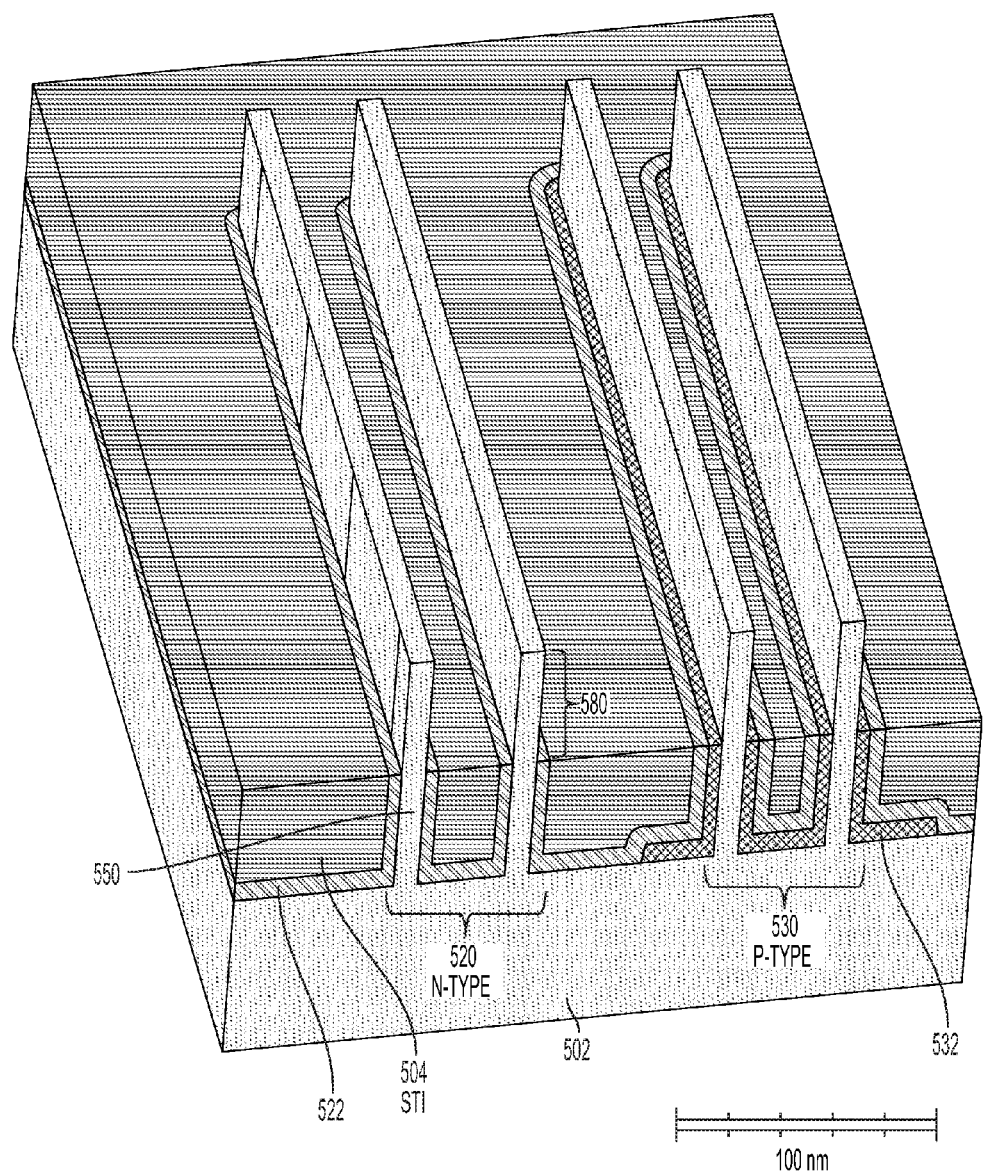

Referring again to FIG. 10A, in block 1006, a shallow trench isolation (STI) material is deposited and etched to stop on the hardmask of the doped sub-fin regions. As shown in FIG. 6F, a shallow trench isolation material is deposited to form an STI region 504. The STI region 504 is etched to stop on the hardmask 554 of the fins 550. As shown in FIG. 6G, the STI region 504, the p-type doped oxide 532 and the n-type doped oxide 522 are etched to expose the hardmask 554. In block 1008, the hardmask and the oxide as well as the STI region are etched to expose an active fin portions. As shown in FIG. 6H, the hardmask 554 is removed from the fins 550. In FIG. 6I, the STI region 504 and the oxide layer 552 are etched to expose active fin portions 580 of the fins 550.

Figure 6J:
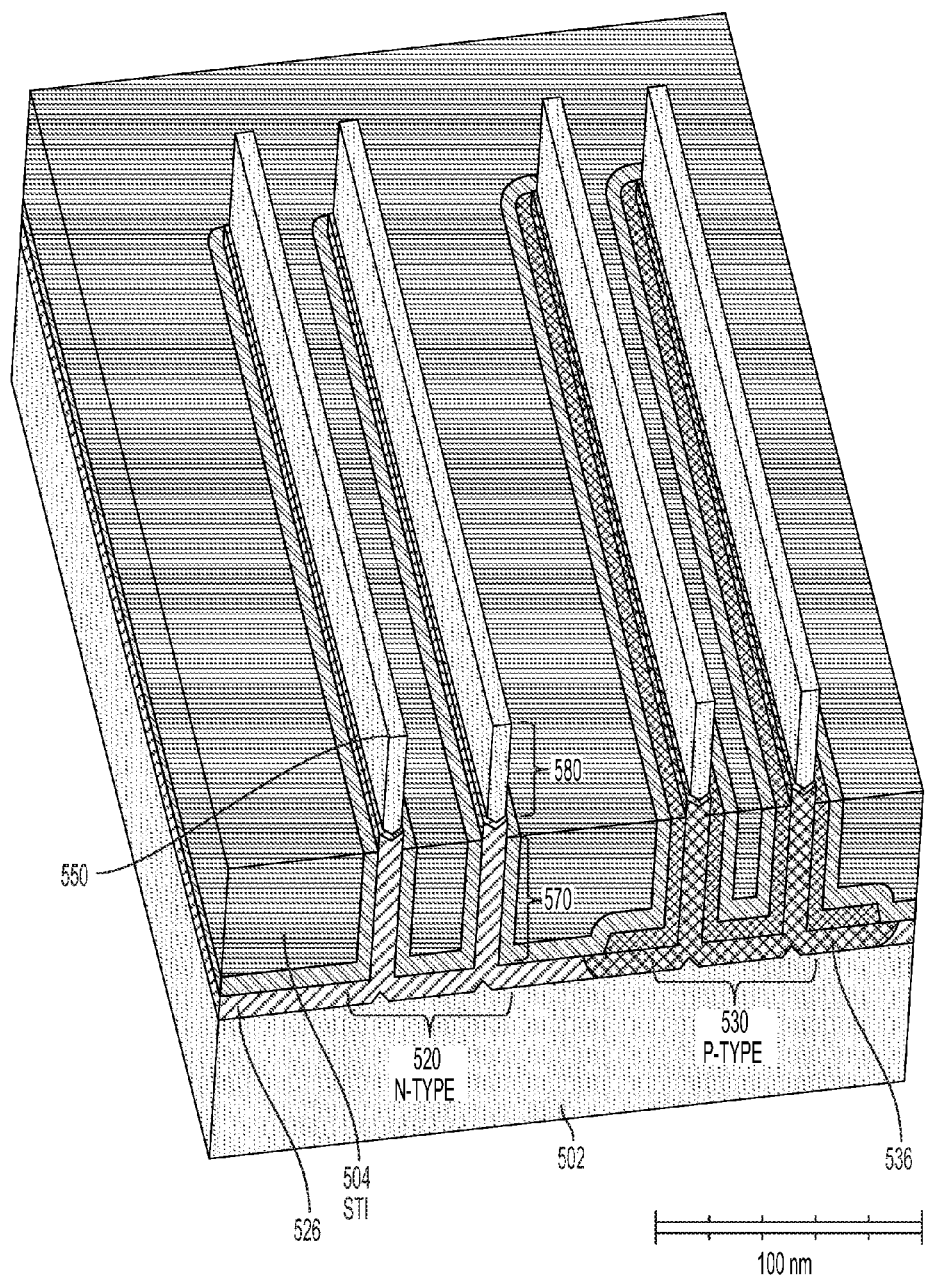

Referring again to FIG. 10A, in block 1010, the fin-based IC device 500 is annealed to drive the dopant into the doped sub-fin regions to form doped sub-fin portions of the fins. As shown in FIG. 6J, the n-type doped oxide 522 is driven into a base portion of the fins 550 to form doped sub-fin portions 570 of the fins 550 within the n-type region 520 to form an n-type diffused dopant 526. In addition, the p-type doped oxide 532 is driven into the doped sub-fin regions to form doped sub-fin portions 570 of the fins 550 within the p-type region 530 to form a p-type diffused dopant 536. The n-type diffused dopant 526 and the p-type diffused dopant 536 are used in place of ion implantation used in planar devices to control sub fin leakage. The n-type diffused dopant 526 and the p-type diffused dopant 536 may also provide isolation between the n-type region 520 and the p-type region 530. As shown in FIGS. 7A-7I, gate formation is performed in which a work function material of the isolation devices is altered to raise a threshold voltage of the isolation devices to reduce a leakage current of the isolation devices.

Figure 7A:
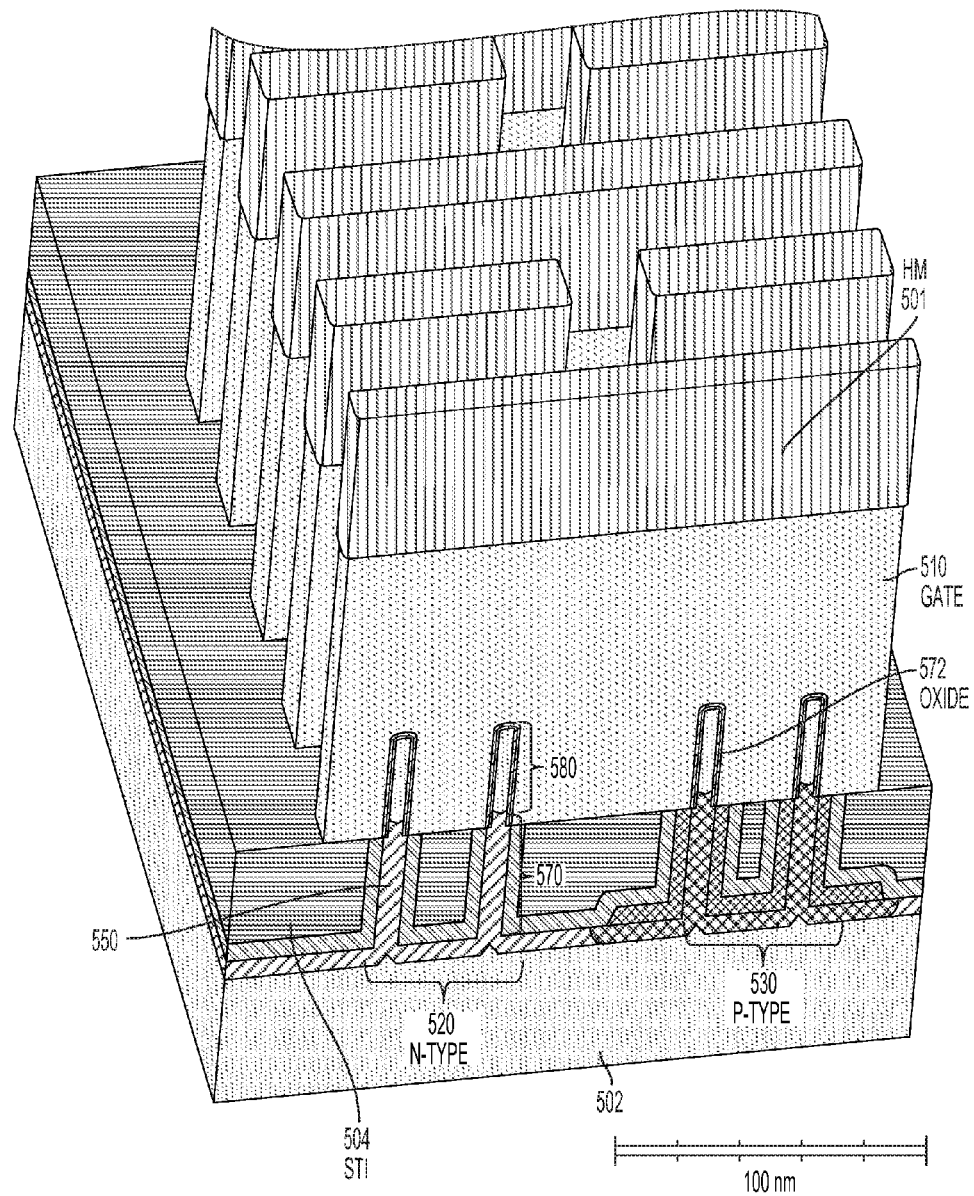
FIGS. 7A-7I illustrate cross-sectional views showing alteration of a work function material of the isolation devices of the integrated circuit (IC) device of FIG. 5 in an aspect of the present disclosure.
Figure 7B:
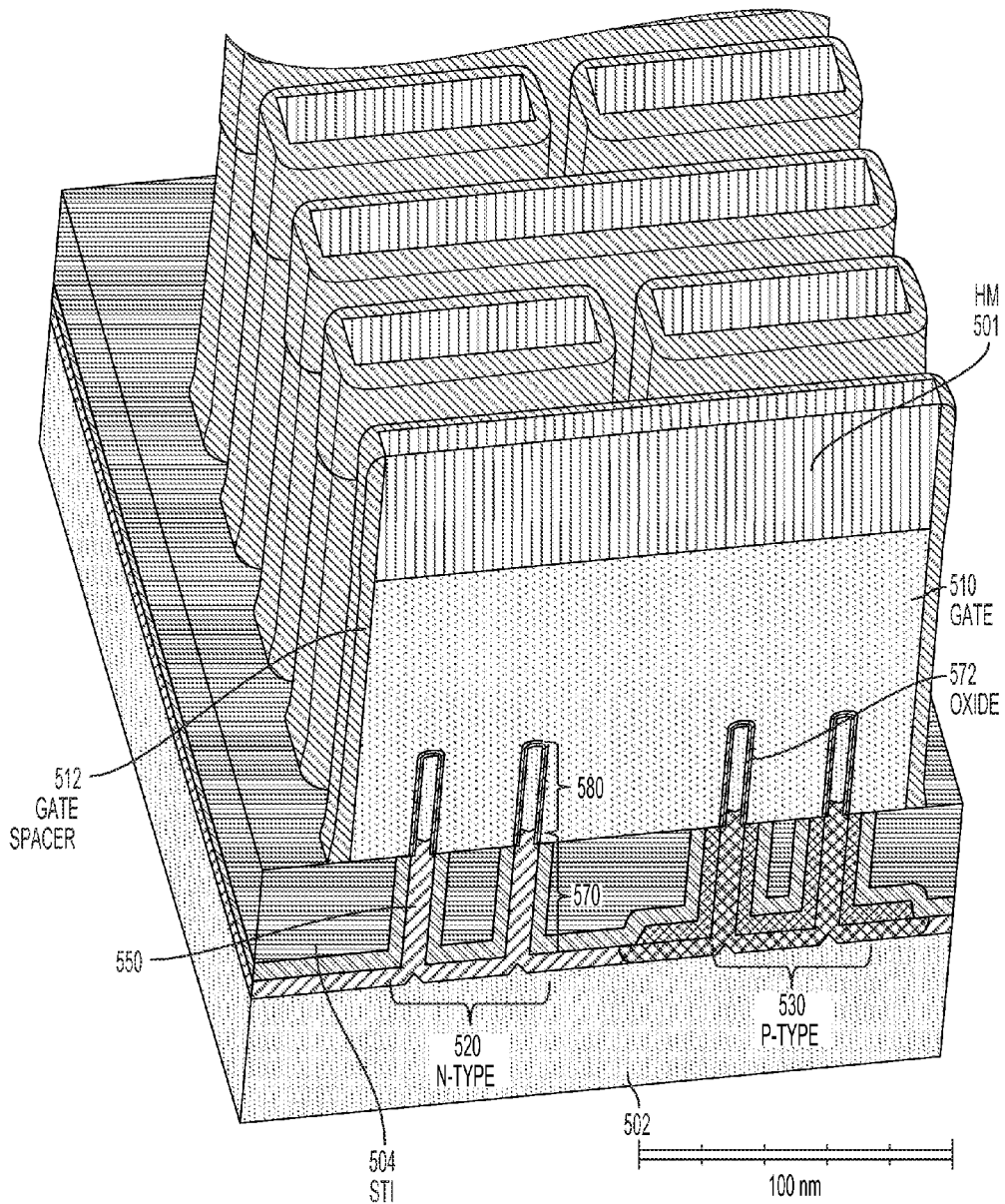

Referring to again to FIG. 10A, in block 1012, a wafer is patterned to form a dummy poly gate on active fin portions of an IC device. As shown in FIG. 7A, an incoming wafer is depicted after a dummy poly gate patterning process is completed to form a dummy poly gate (e.g., silicon (Si)). In this example, a hardmask 501 (e.g., silicon nitride (SiN)) is arranged on the active gates 510 during the patterning of the active gates 510. The active gates 510 are supported by the STI region 504, which is supported by a substrate 502. In block 1014, a gate spacer (e.g., a nitride-based low-K gate spacer) is formed on sidewalls of the dummy gate and the hardmask. For example, as shown in FIG. 7B, a gate spacer 512 is formed on the sidewalls of the active gates 510 and the hardmask 501. In addition, an oxide 572 is deposited on the active fin portions 580.

Figure 7C:
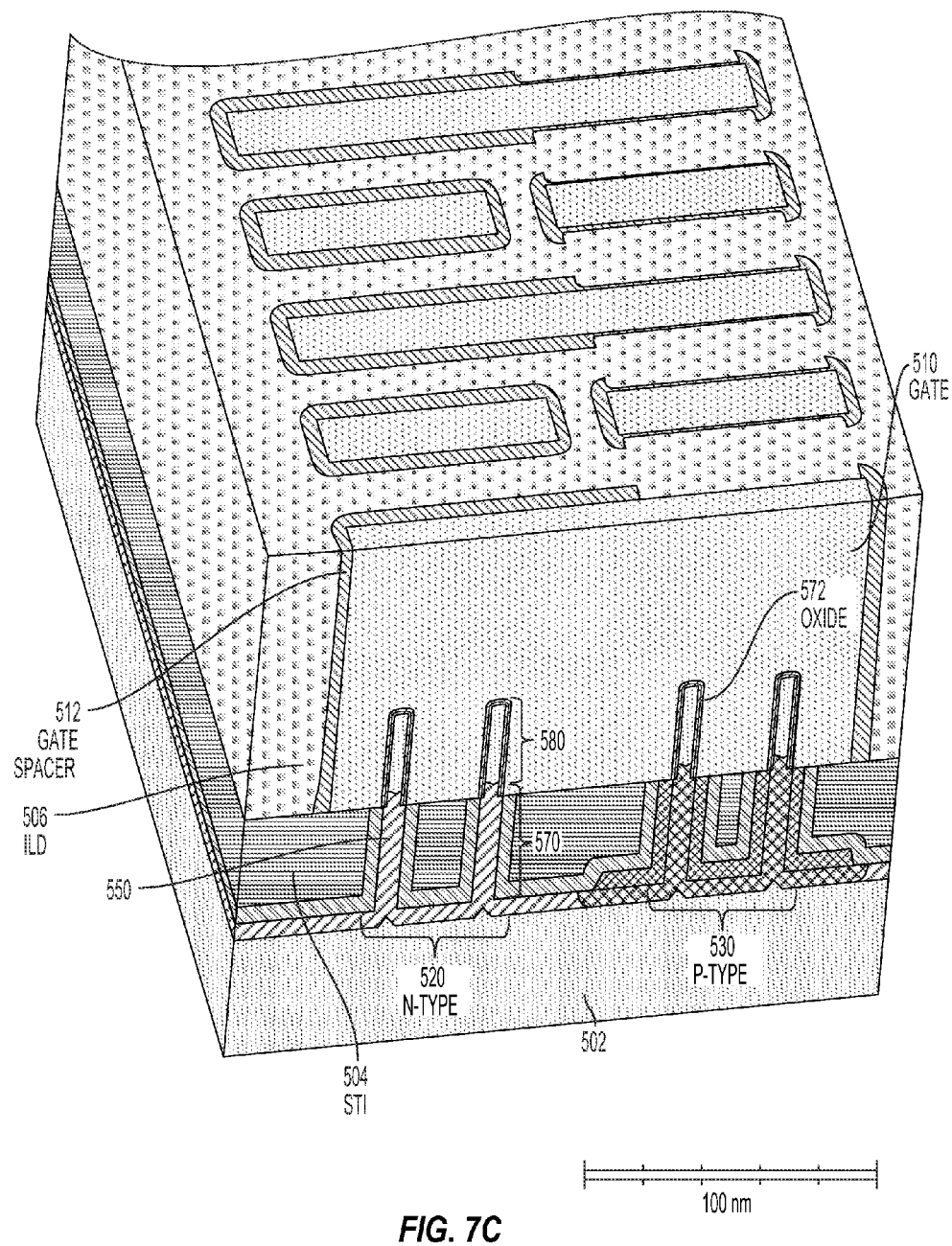
Figure 7D:
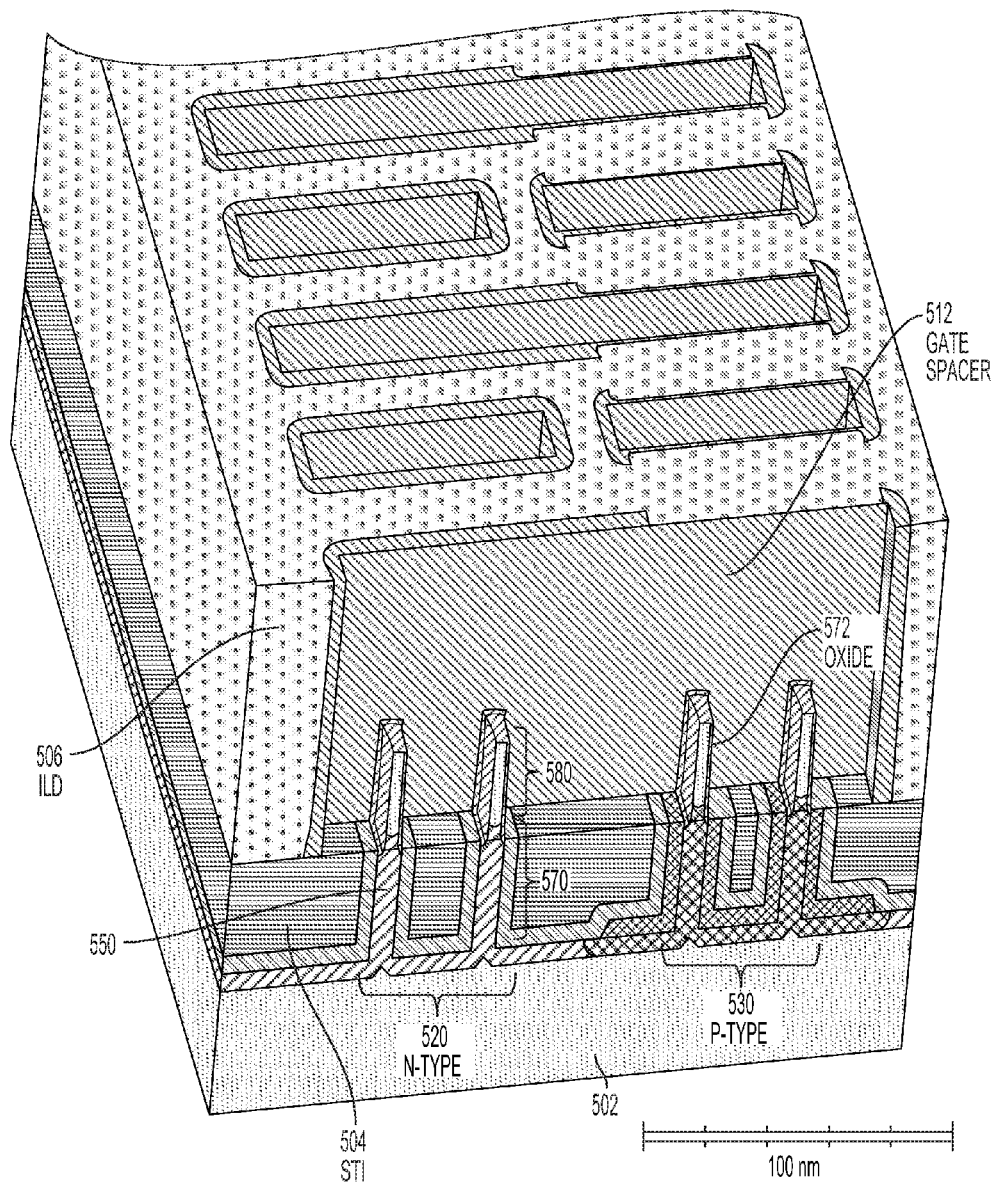
Figure 10B:
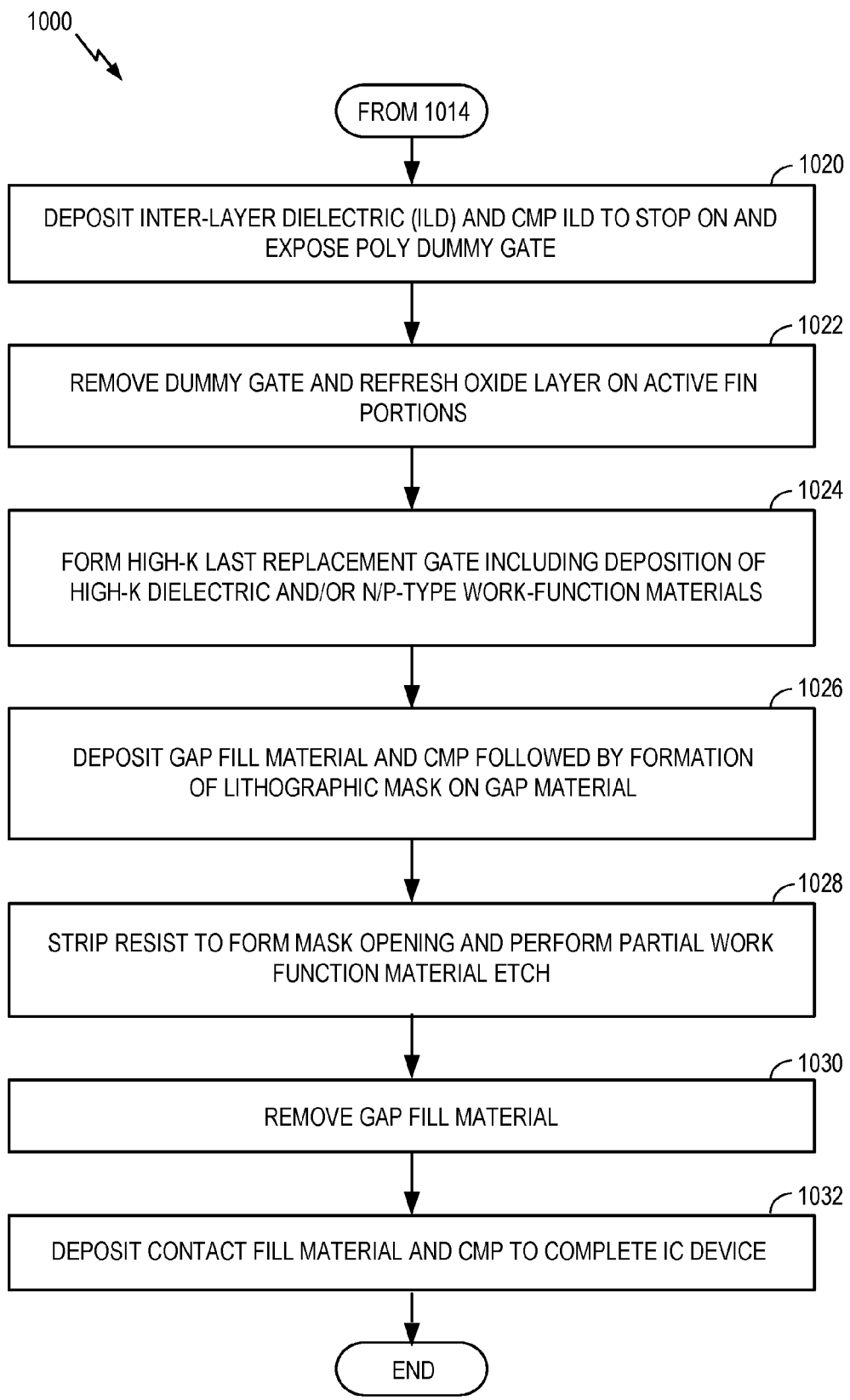

FIG. 10B further illustrates the method 1000 of FIG. 10A for fabricating an IC device including isolation devices having an altered work function material according to an aspect of the present disclosure. In block 1020, an interlayer dielectric (ILD) is deposited on the IC device and a chemical mechanical polish (CMP) process is performed on the ILD material to stop on and expose the poly dummy gate. As shown in FIG. 7C, the CMP process is performed on an ILD 506 to expose the active gates 510. In block 1022, the dummy gate is removed and the oxide layer on the active fin portions is refreshed. As shown in FIG. 7D, the active gates 510 are removed and the oxide 572 (e.g., silicon oxide (SiO$_2$)) on the active fin portions 580 is refreshed to expose the active fin portions 580 of the fins 550. In block 1024, a replacement gate process is performed to replace the dummy gate with an active gate, for example, as shown in FIG. 7E.

Figure 7E:
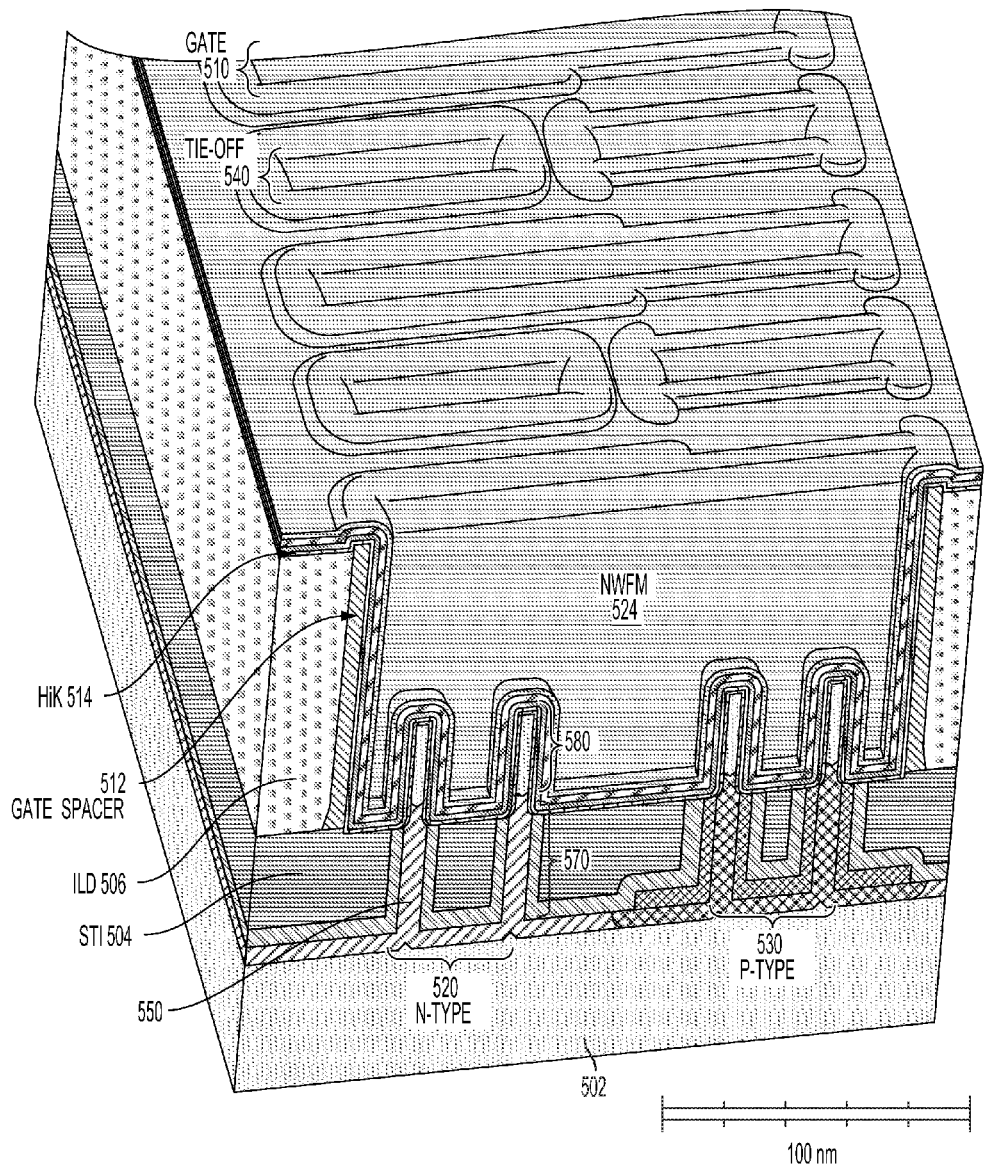

As shown in FIG. 7E, a high-K dielectric layer 514 is deposited on the exposed portion of the active fin portions 580 of both the active gates 510 and the tie-off gates 540. A first work function material (WFM) (e.g., NWFM 524) is deposited on the active fin portions 580 within both the n-type region 520 and the p-type region 530 of both the active gates 510 and the tie-off gates 540. In this arrangement, the work function material is partially removed to form a second work function material (WFM) (e.g., a PWFM 534) in alternative ones of the n-type region 520 and the p-type region 530, as shown in FIGS. 7F-7I.

Figure 7F:
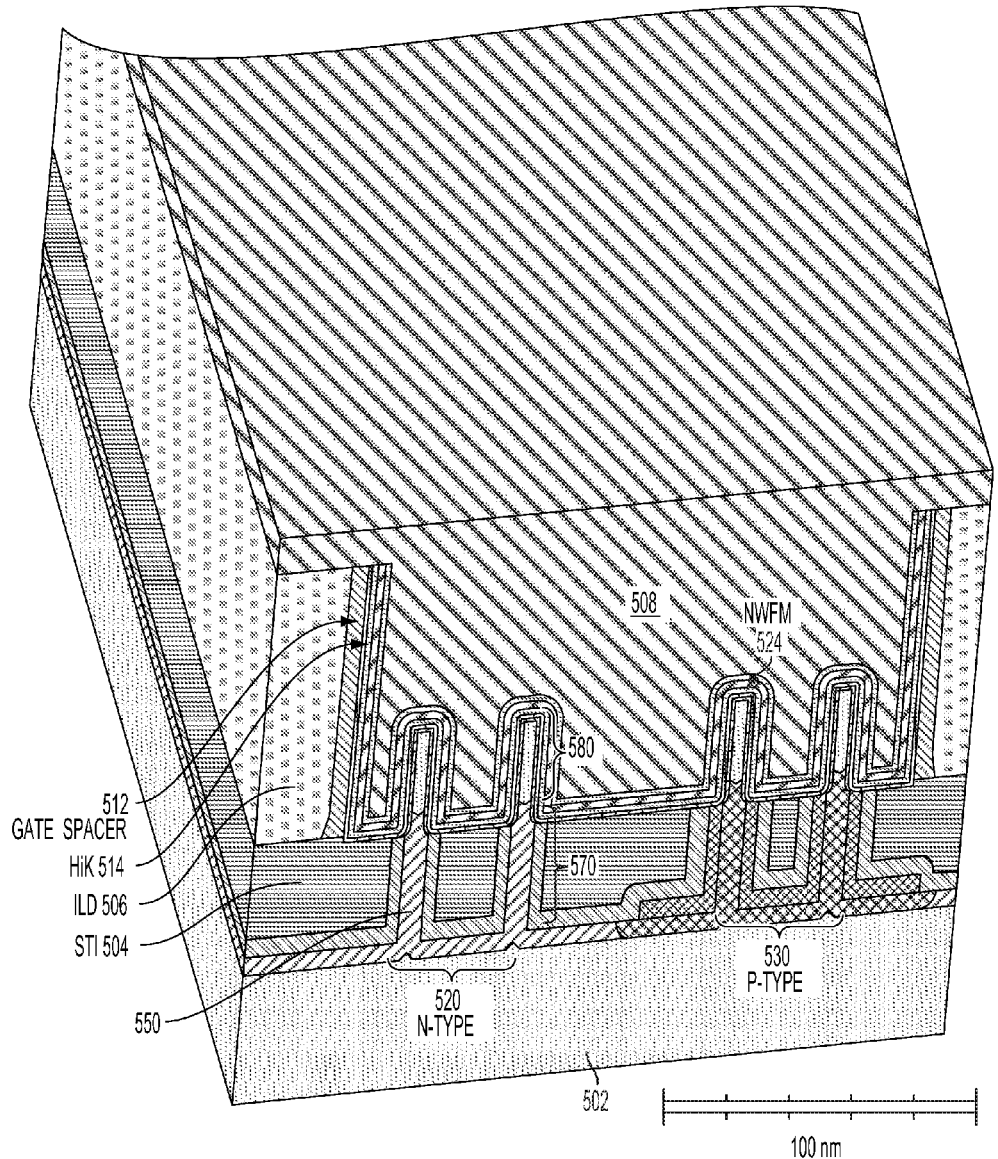
Figure 7G:
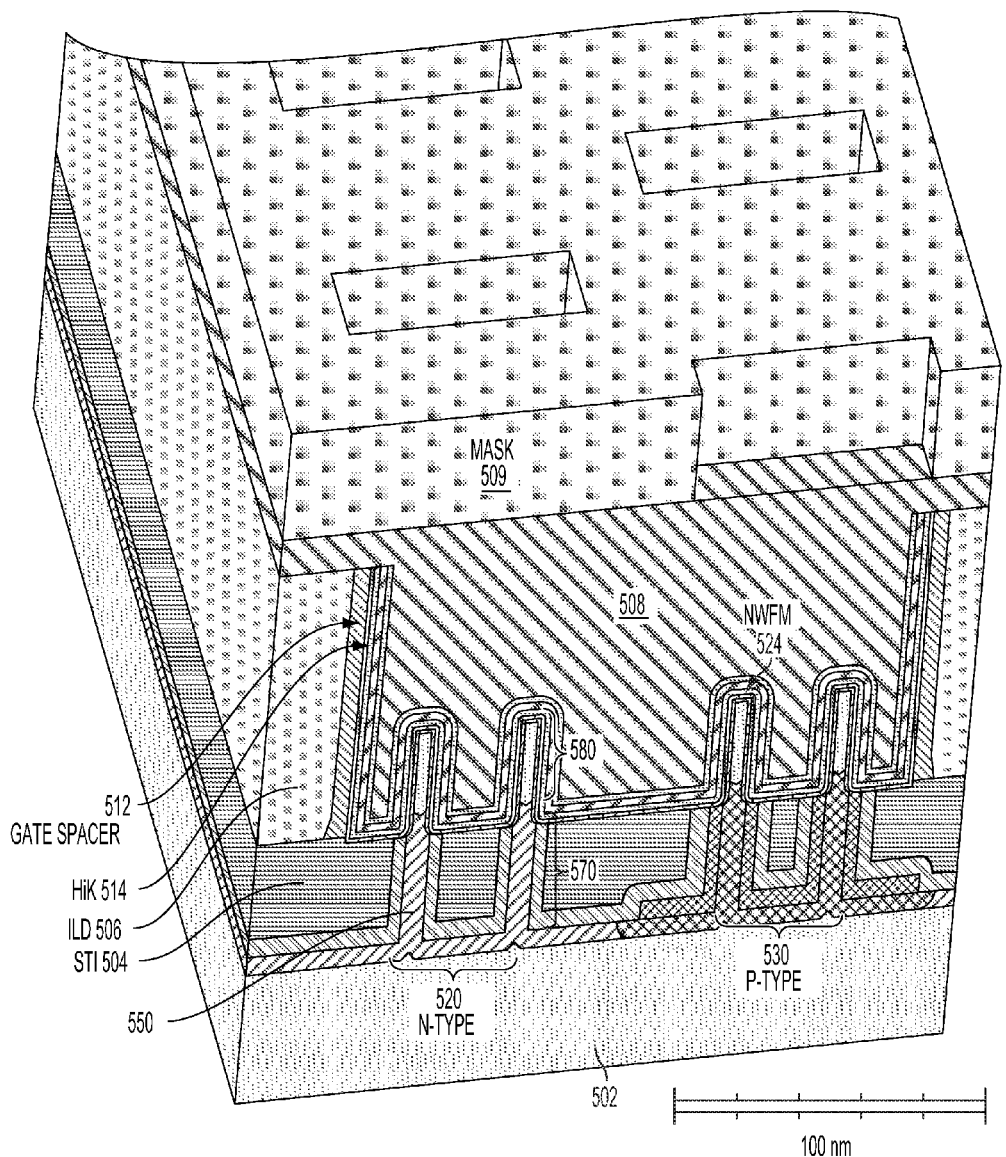
Figure 7H:
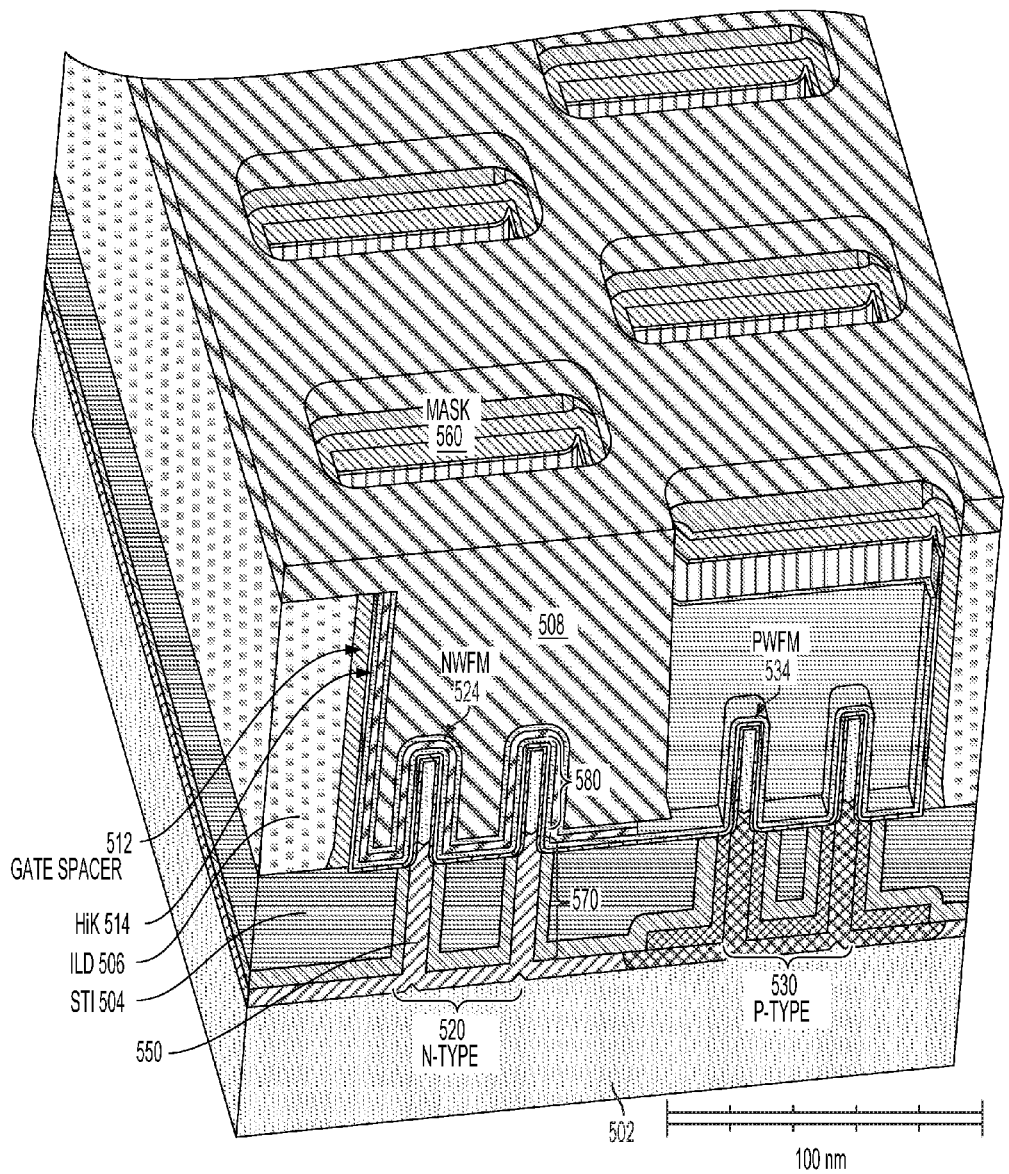

Referring again to FIG. 10B, in block 1026 a gap fill material is deposited on the work function material of a gate stack and a lithographic mask is formed on the gap fill material. As shown in FIG. 7F, a gap fill material 508 is deposited on the n-type work function material (e.g., NWFM 524) within both the n-type region 520 and the p-type region 530. In FIG. 7G, a lithographic mask 509 is deposited on the gap fill material 508 to define a mask of openings within the gap fill material 508 to expose the work function material (e.g., NWFM 524) on alternating ones of the n-type region 520 and the p-type region 530. In block 1028, a strip resist is performed to form a mask opening and a partial etch of the exposed work function material then occurs. As shown in FIG. 7H, a strip resist process removes the lithographic mask 509 and forms the mask openings 560 exposing the work function material (e.g., NWFM 524) on alternating ones of the n-type region 520 and the p-type region 530. For example, a partial etch of a portion of the n-type work function material (e.g., NWFM 524) forms the p-type work function material (e.g., PWFM 534) within the p-type region 530.

Figure 7I:
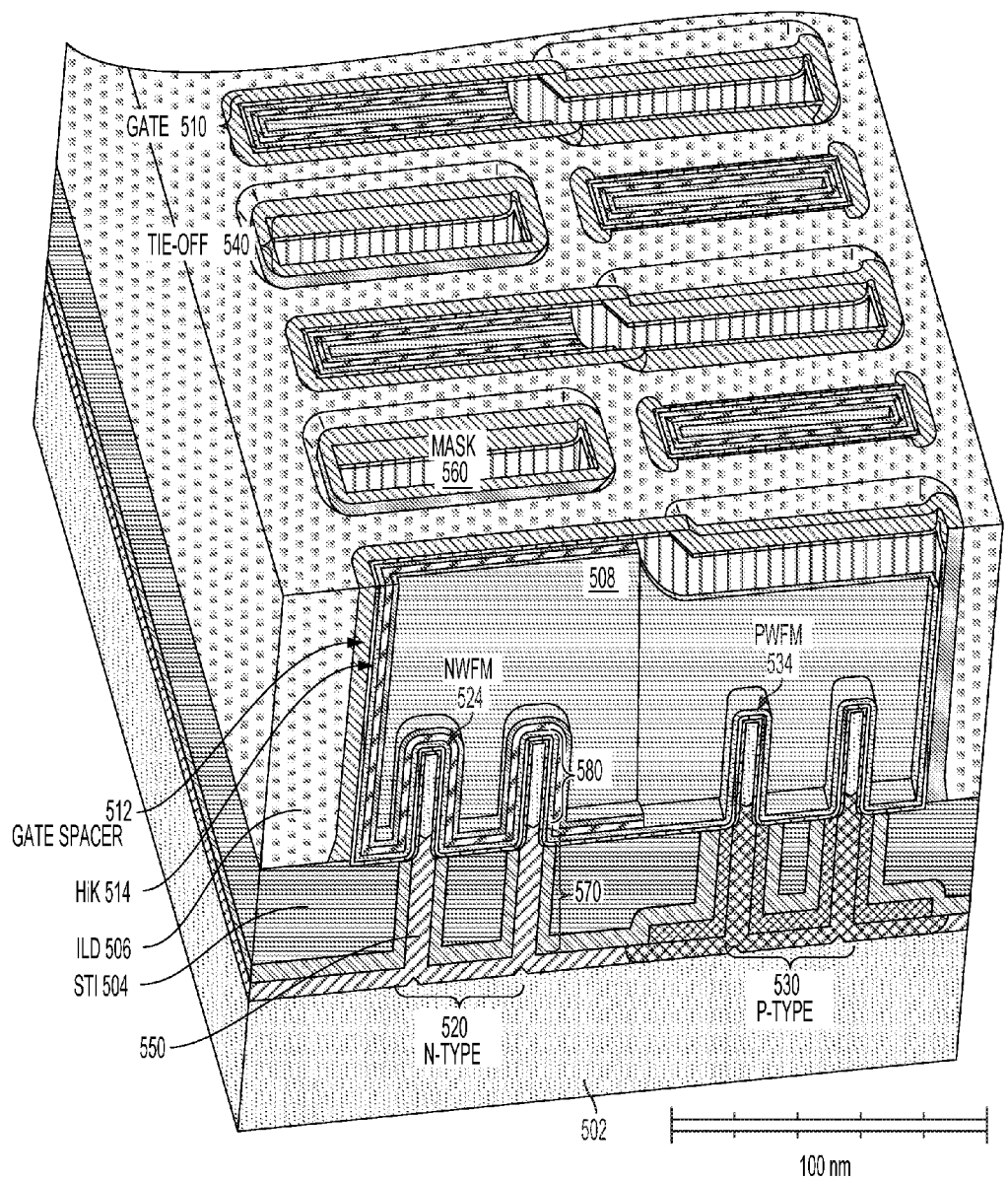

Referring again to FIG. 10B, in block 1030, the gap fill material is removed. In FIG. 7I, the gap fill material 508 is removed to expose the work function material (e.g., NWFM 524 or PWFM 534) of both the active gates 510 and the tie-off gates 540 through the mask openings 560. In block 1032, a conductive fill material is deposited on the exposed work function material through the mask opening, and a CMP process on the conductive fill material completes the IC device. As shown in FIG. 8, a conductive fill material 816 (e.g., tungsten (W) or cobalt (Co)) is deposited on the n-type work function material (e.g., NWFM 824) and the p-type work function material (e.g., PWFM 834) to complete formation of the active gates 810 and the tie-off gates 840. Finally, a CMP process is performed to stop on the ILD 806.

As shown in FIG. 8, a gate-all-around (GAA) nanowire-based IC device 800 includes an STI region 804 surrounding the doped regions 870 and supported by a substrate 802. The active regions 880 are disposed on the doped regions 870. When the doped regions 870 are of an n-type (e.g., an NFET), the doped regions 870 are composed of a phosphorous doped material. When the doped regions 870 are of a p-type (e.g., a PFET), the doped regions 870 are composed of a boron doped material. The GAA nanowire-based IC device 800 includes active devices (e.g., active gates 810) and isolation devices (e.g., the tie-off gates 840). The active gates 810 include a first portion within an n-type region 820 having an n-type work function material (NWFM) 824, and a second portion within a p-type region 830 having a p-type work function material (PWFM) 834 on a high-K dielectric layer 814. The tie-off gates 840 may be formed within the n-type region 820 or the p-type region 830.

In one aspect of the disclosure, the work function material of the tie-off gates 840 is altered. For example, although one of the tie-off gates 840 is in the n-type region 820, the work function material is of the p-type work function material (e.g., PWFM 834). Likewise, although the other of the tie-off gates 840 is in the p-type region 830, the work function material is of the n-type work function material (e.g., NWFM 824). In this aspect of the disclosure, altering the work function material of the tie-off gates 840 increases a threshold voltage of the tie-off gates 840. This may reduce the leakage current of the tie-off gates 840 while providing improved electrical isolation between the active device and other active devices without relying on a physical disconnection of the isolation devices (e.g., the tie-off gates 840).

In this arrangement, the active gates 810 include a gate spacer 812 (e.g., a nitride-based low-K gate spacer) on sidewalls of the active gates 810. A conductive fill material 816 (e.g., tungsten (W) or cobalt (Co)) is disposed on the work function material (e.g., NWFM 824 or PWFM 834) of the active regions 880. The work function material is deposited on a high-k dielectric layer 814 on the gate spacer 812. The fin-based IC device 500 may be formed as shown in FIGS. 6A-6J and 7A-7I. The fin-based IC device 500 may include gate-all-around (GAA) nanowire-based active devices, fin-based active devices, or other like three-dimensional active devices. A process for forming the fin-based IC device 500, as shown in FIGS. 6A-7I, is described with reference to FIGS. 10A and 10B. This process may be modified according to aspects of the present disclosure for a GAA nanowire-based IC device, for example, as shown in FIG. 8.

Aspects of the present disclosure include an innovative integration flow to alter a work function material disposed on the active source/drain regions of either a fin-based active device or a fin-based isolation device. Additional aspects of the present disclosure can alter a work function material disposed on the active source/drain regions of gate-all-around (GAA) nanowire-based devices and other like three-dimensional structure to reduce leakage current within the isolation device. Adjacent device isolation using altered work function materials may enable operation within the reduced device geometries of advanced logic technology, such as seven (7) nanometer logic technology and beyond. A work function alteration is self-aligned to the active devices and may be performed using existing materials and process capabilities with no additional steps. This aspect of the present disclosure also provides a reduction in the fabrication penalty for forming an isolation device within the active circuit area.

One aspect of the present disclosure alters the work function material of either the active device or the tie-off device, such that the active device and the corresponding tie-off device have different work function materials. For high performance active devices, which have a low threshold voltage, having a similar work-function material (e.g., a p-type work function metal (PWFM) or an n-type work function metal (NWFM)) in the corresponding tie-off device increases the possibility of leakage current. By altering the work function material of the either active device or the tie-off device, which may be done in the gate stack, the threshold of the tie-off device is changed from a lower threshold voltage to a higher threshold voltage. This may reduce the leakage current and also may provide isolation between the active device and other active devices, such as adjacent active devices on an integrated circuit.

According to an aspect of the present disclosure, a fin-based structure is described. In one configuration, the fin-based structure includes means for isolating between fins of the fin-based structure. The isolating means may be an isolation device (e.g., tie-off gates 540/840). In another aspect, the aforementioned means may be any module or any apparatus or material configured to perform the functions recited by the aforementioned means.

Figure 11:
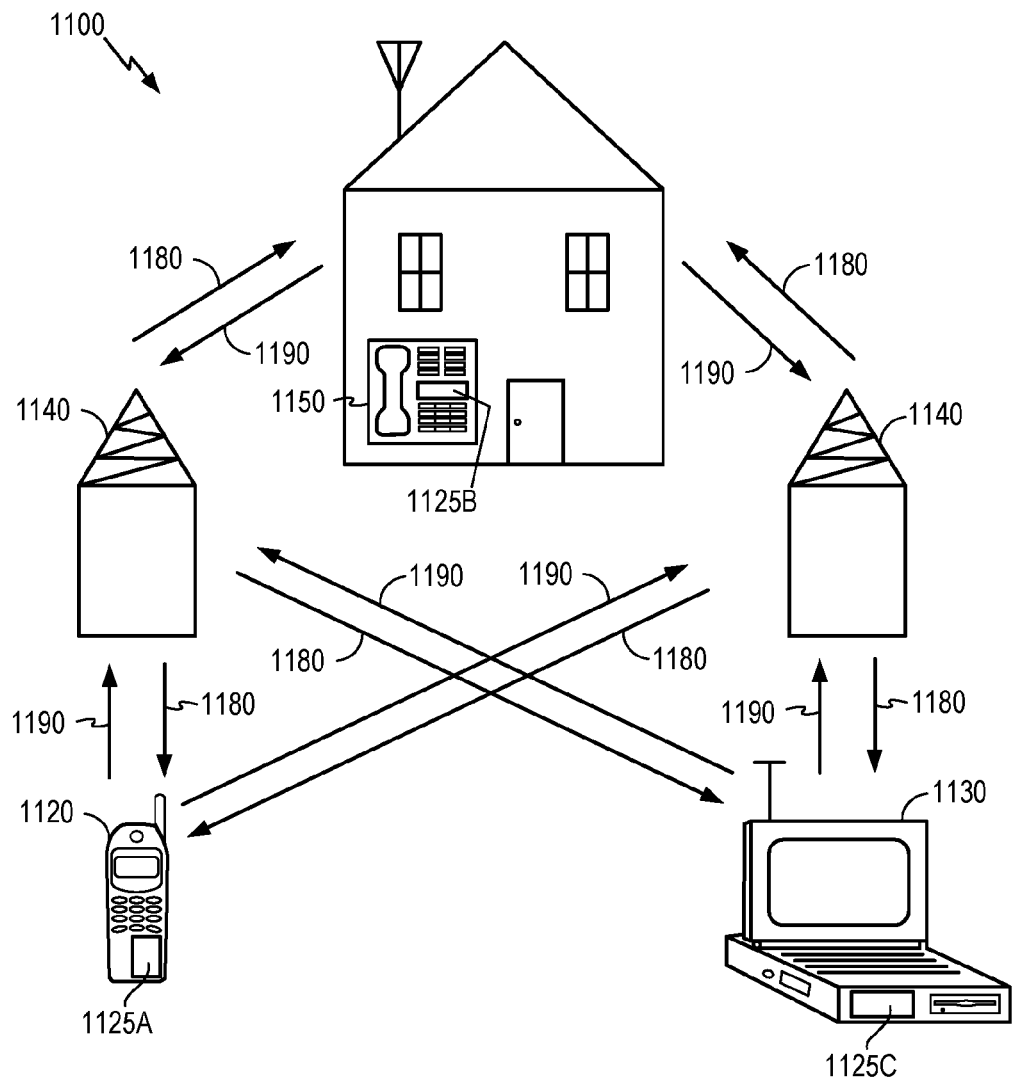
FIG. 11 is a block diagram showing an exemplary wireless communication system in which an aspect of the disclosure may be advantageously employed.

FIG. 11 is a block diagram showing an exemplary wireless communication system 1100 in which an aspect of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C, and 1125B that include the disclosed isolation devices with altered work functions. It will be recognized that other devices may also include the disclosed isolation devices, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music players, a video player, an entertainment unit, a fixed location data unit such as meter reading equipment, or other devices that store or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed isolation devices.

Figure 12:
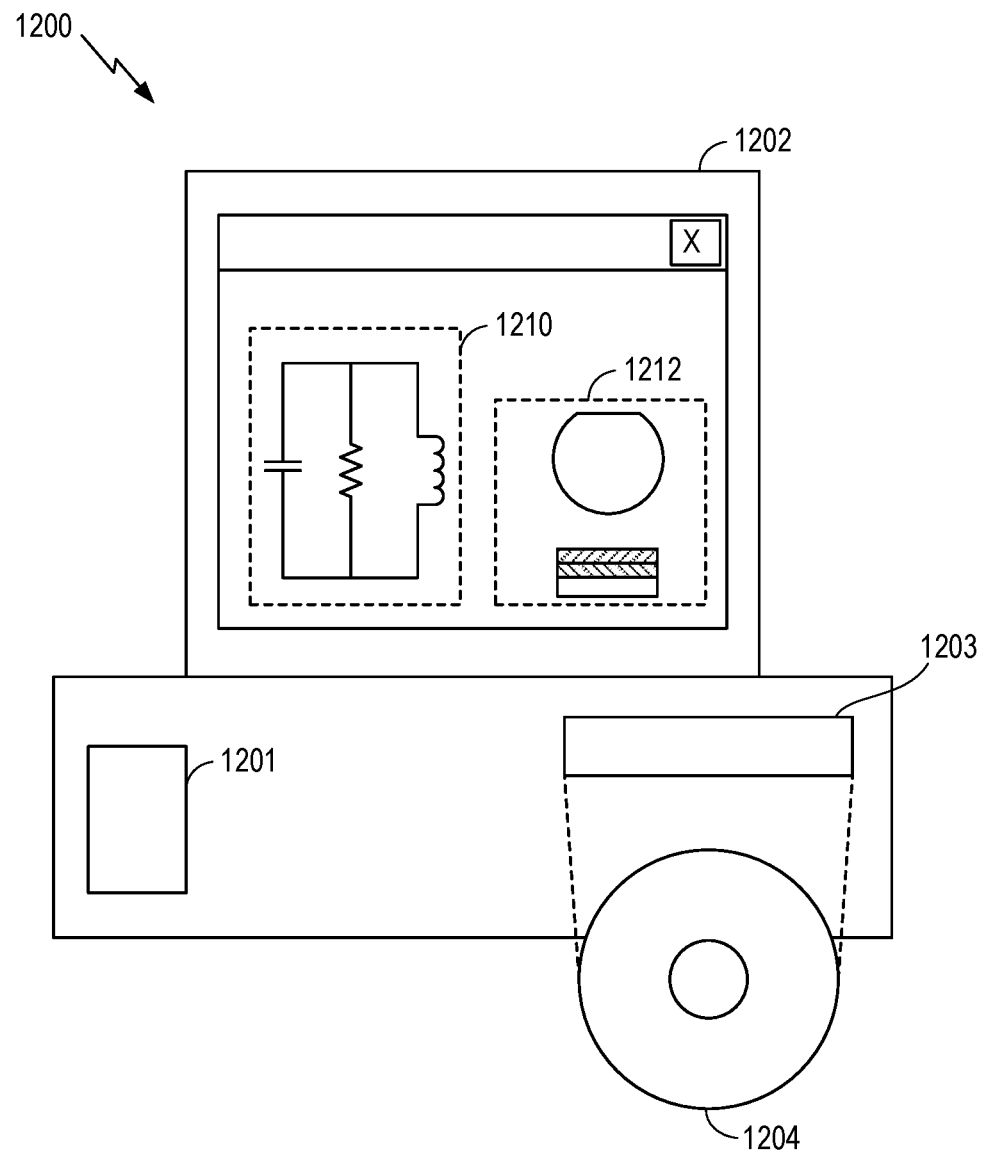
FIG. 12 is a block diagram illustrating a design workstation used for circuit, layout, and logic design of a fin-based structure according to one configuration.

FIG. 12 is a block diagram illustrating a design workstation used for circuit, layout, and logic design of an IC structure, such as the isolation devices disclosed above. A design workstation 1200 includes a hard disk 1201 containing operating system software, support files, and design software such as Cadence or OrCAD. The design workstation 1200 also includes a display 1202 to facilitate design of a circuit 1210 or an IC device 1212 including an isolation device. A storage medium 1204 is provided for tangibly storing the design of the circuit 1210 or the IC device 1212. The design of the circuit 1210 or the IC device 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the fin-based structure 1212 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for altering a work function material of a first isolation transistor and a second isolation transistor within an integrated circuit (IC) device, the method comprising:
doping, with a first-type channel dopant concentration, a sub-fin portion of a first-type active transistor and a sub-fin portion of the first isolation transistor adjacent to the first-type active transistor within a first-type region;

doping, with a second-type channel dopant concentration, a sub-fin portion of a second-type active transistor and a sub-fin portion of the second isolation transistor adjacent to the second-type active transistor within a second-type region;

depositing a first-type work function material on the first-type active transistor within the first-type region and on the second-type active transistor within the second-type region adjacent to the first-type active transistor;

depositing the first-type work function material on the first isolation transistor within the first-type region and on the second isolation transistor within the second-type region adjacent to the first isolation transistor;

exposing the first-type work function material of the first isolation transistor within the first-type region and the first-type work function material of the second-type active transistor within the second-type region;

etching the first-type work function material of the first isolation transistor and the second-type active transistor to concurrently form a second-type work function material for the first isolation transistor within the first-type region and the second-type active transistor within the second-type region; and depositing a conductive fill material on the second-type work function material of the first isolation transistor and the second-type active transistor.

2. The method of claim 1, further comprising biasing a gate of the first isolation transistor and a gate of the second isolation transistor to place the first isolation transistor and the second isolation transistor in an OFF state.

3. The method of claim 1, further comprising doping a source/drain portion of the first-type active transistor and the first isolation transistor using a solid state dopant.

4. The method of claim 1, in which exposing comprises:
depositing a mask to define openings to the first isolation transistor and the second-type active transistor within alternating n-type regions and p-type regions; and
performing a strip resist process to expose the first isolation transistor and the second-type active transistor within the alternating n-type regions and p-type regions.

5. The method of claim 1, in which the IC device is integrated into a mobile phone, a set top box, a music player, a video player, an entertainment unit, a navigation device, a computer, a hand-held personal communication systems (PCS) unit, a portable data unit, and/or a fixed location data unit.

6. A method for altering a work function material of a first isolation transistor and a second isolation transistor within an integrated circuit (IC) device, the method comprising:
the step for doping, with a first-type channel dopant concentration, a sub-fin portion of a first-type active transistor and a sub-fin portion of the first isolation transistor adjacent to the first-type active transistor in a first-type region;

the step for doping, with a second-type channel dopant concentration, a sub-fin portion of a second-type active transistor and a sub-fin portion of the second isolation transistor adjacent to the second-type active transistor in a second-type region;

the step for depositing a first-type work function material on the first-type active transistor within the first-type region and on the second-type active transistor within the second-type region adjacent to the first-type active transistor;

the step for depositing a second-type work function material on the first isolation transistor within the first-type region and on the second isolation transistor within the second-type region adjacent to the first isolation transistor;

the step for exposing the first-type work function material of the first isolation transistor within the first-type region and the first-type work function material of the second-type active transistor within the second-type region;

the step for etching the first-type work function material of the first isolation transistor and the second-type active transistor to concurrently form a second-type work function material for the first isolation transistor within the first-type region and the second-type active transistor within the second-type region; and the step for depositing a conductive fill material on the second-type work function material of the first isolation transistor and the second-type active transistor.

7. The method of claim 6, further comprising the step for biasing a gate of the first isolation transistor and the second isolation transistor to place the first isolation transistor and the second isolation transistor in an OFF state.

8. The method of claim 6, further comprising the step for doping a source/drain portion of the first-type active transistor and the first isolation transistor using a solid state dopant.

9. The method of claim 6, in which the step for exposing comprises:
the step for depositing a mask to define openings to the first isolation transistor and the second-type active transistor within alternating n-type regions and p-type regions; and
the step for performing a strip resist process to expose the first isolation transistor and the second-type active transistor within the alternating n-type regions and p-type regions.

10. The method of claim 6, in which the IC device is integrated into a mobile phone, a set top box, a music player, a video player, an entertainment unit, a navigation device, a computer, a hand-held personal communication systems (PCS) unit, a portable data unit, and/or a fixed location data unit.

* * * * *